(12) United States Patent
Endo et al.

(10) Patent No.: US 12,384,392 B2
(45) Date of Patent: Aug. 12, 2025

(54) CONTACT DECIDING APPARATUS

(71) Applicant: Alps Alpine Co., Ltd., Tokyo (JP)

(72) Inventors: Shinichi Endo, Miyagi-ken (JP); Sho Taguchi, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 197 days.

(21) Appl. No.: 18/305,716

(22) Filed: Apr. 24, 2023

(65) Prior Publication Data

US 2023/0365147 A1    Nov. 16, 2023

(30) Foreign Application Priority Data

May 16, 2022  (JP) ................................. 2022-080014

(51) Int. Cl.
    *B60W 50/08*     (2020.01)
    *B60W 40/08*     (2012.01)
    *B60W 50/00*     (2006.01)

(52) U.S. Cl.
    CPC ............ *B60W 50/08* (2013.01); *B60W 40/08* (2013.01); *B60W 2050/0056* (2013.01)

(58) Field of Classification Search
    CPC .... A61F 13/42; A61F 2013/8491; A61B 5/11; A61B 5/6808; A61B 2562/0219; G06N 20/00; G06N 5/01; G01N 21/78; G01N 21/80; G01N 2021/7759; G01N 2021/7796; G01N 2201/0616; G01N 2201/12707; G01P 15/18
    See application file for complete search history.

(56) References Cited

U.S. PATENT DOCUMENTS

| | | | | |
|---|---|---|---|---|
| 4,707,845 | A * | 11/1987 | Krein | G06F 3/0418 178/18.05 |
| 8,593,423 | B2 * | 11/2013 | Hotelling | G06F 3/04166 345/173 |
| 11,372,036 | B2 * | 6/2022 | Sasai | H03K 17/96 |
| 11,444,623 | B2 * | 9/2022 | Yamada | H03K 17/955 |
| 2015/0277621 | A1 * | 10/2015 | Roberson | H04J 13/004 345/174 |
| 2018/0041217 | A1 * | 2/2018 | Murakami | H03L 7/091 |
| 2020/0067495 | A1 * | 2/2020 | Roberson | G06F 3/0416 |

FOREIGN PATENT DOCUMENTS

JP              2021-178527 A     11/2021

\* cited by examiner

*Primary Examiner* — Rufus C Point
(74) *Attorney, Agent, or Firm* — Harness, Dickey & Pierce, P.L.C.

(57) ABSTRACT

A contact deciding apparatus includes: reference signal creating units that create first and second reference signals, with a sine wave, that have the same frequency as a detection signal output from a sensor unit, and are respectively in phase with and out of phase with the detection signal; a demodulation circuit that creates first and second demodulation signals by multiplying the detection signal respectively by the first and second reference signals; low-pass filters that extract first and second direct-current signals, which are respectively the direct-current components of the first and second demodulation signals; and a contact deciding unit that makes a decision about contact according to the first direct-current signal. The contact deciding unit decides that the connection state between the sensor unit and the detection circuit is abnormal when the first and second direct-current signals change in the same direction and normal when these signals change in opposite directions.

4 Claims, 15 Drawing Sheets

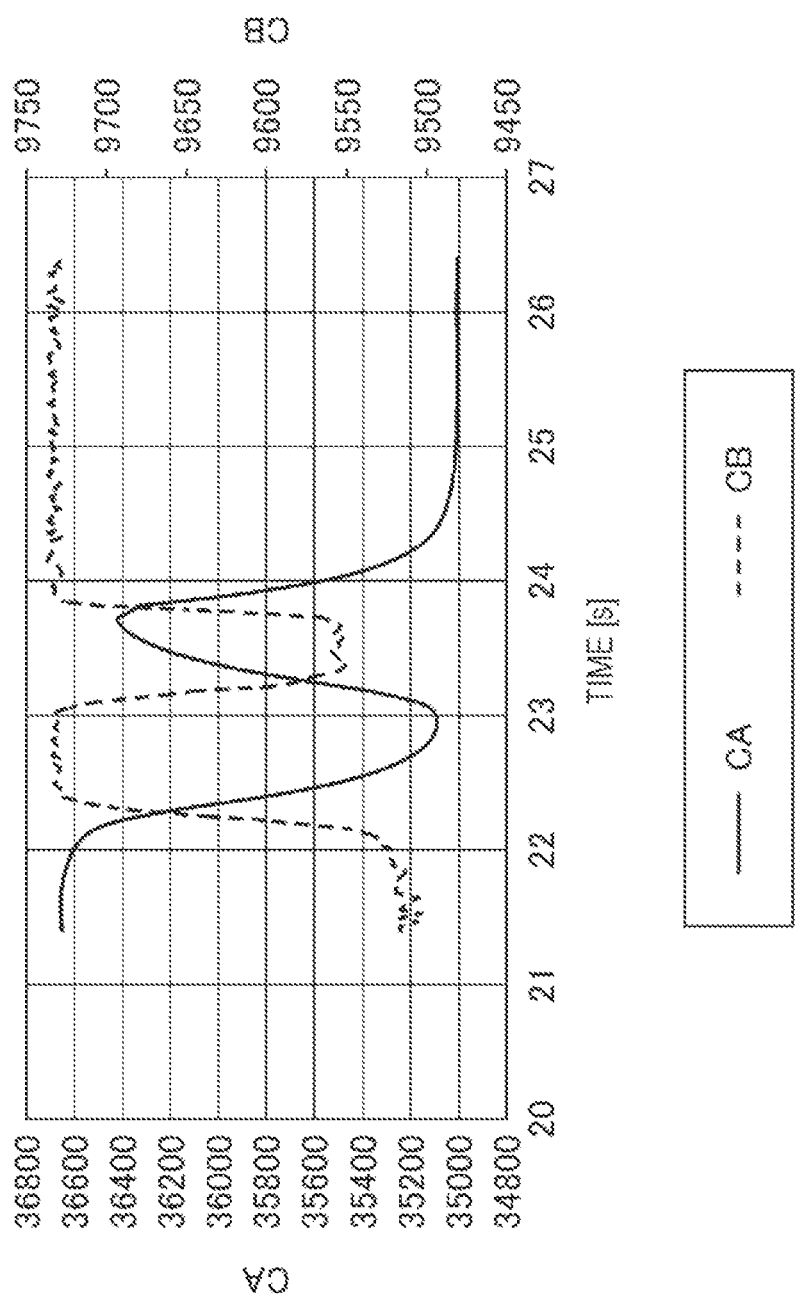

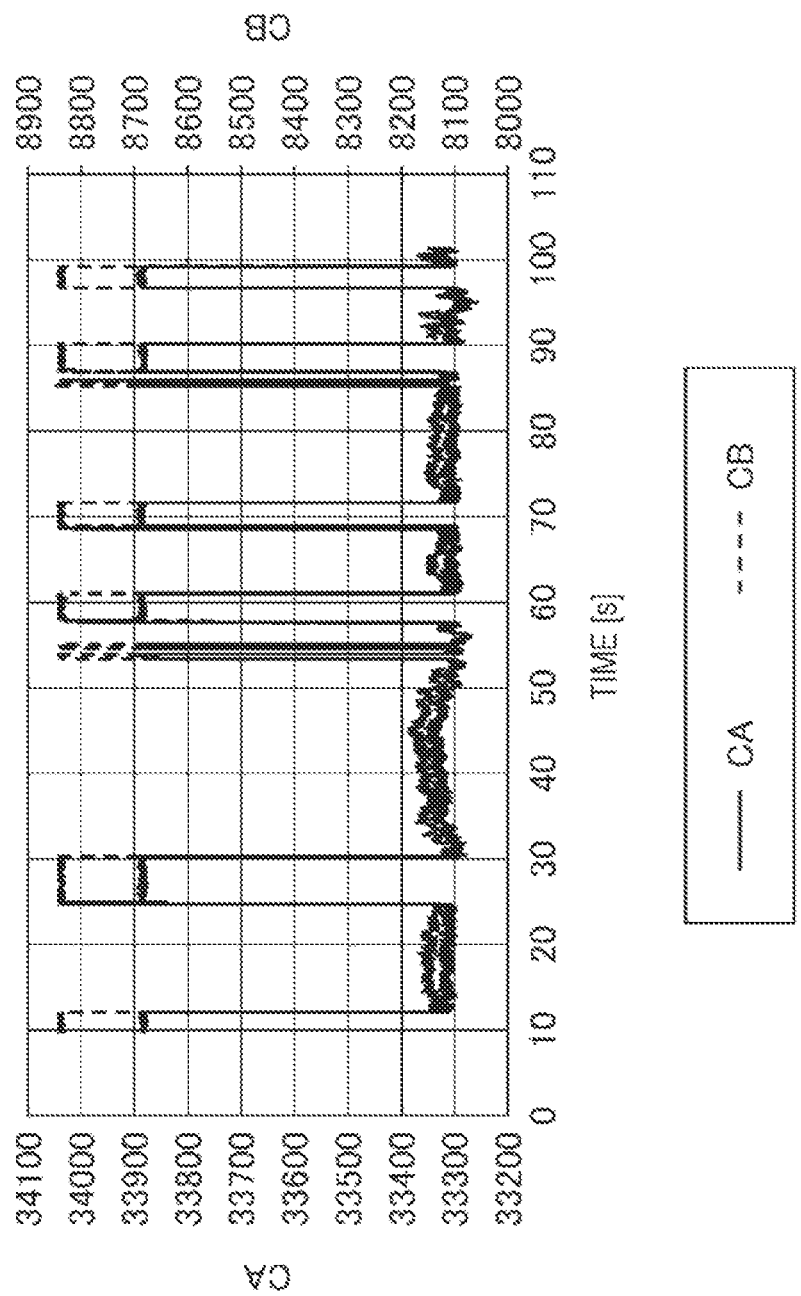

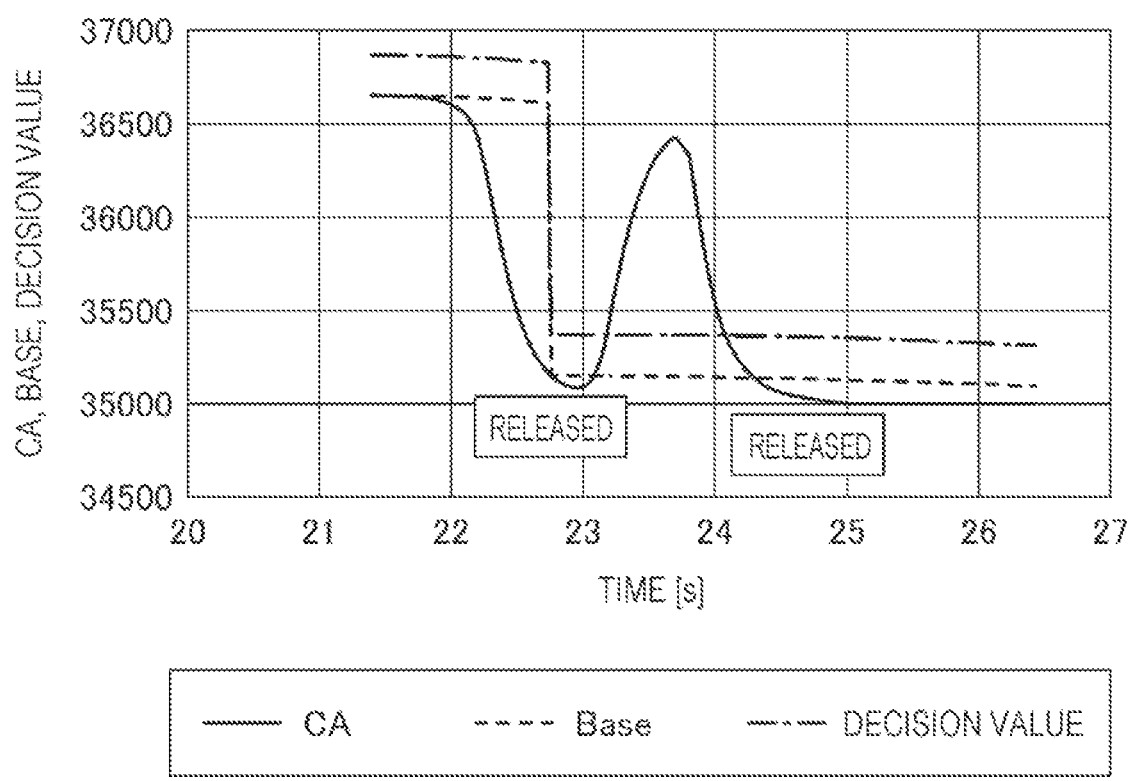

CONTACT DECIDING APPARATUS

CLAIM OF PRIORITY

This application claims benefit of Japanese Patent Application No. 2022-080014 filed on May 16, 2022, which is hereby incorporated by reference in its entirety.

BACKGROUND OF THE INVENTION

1. Field of the Invention

The present invention relates to a contact deciding apparatus.

2. Description of the Related Art

Some automobiles can achieve autonomous driving only under the condition that they drive on an expressway or drive at low speeds. Automobiles of this type need to detect the state of the driver to safely switch between autonomous driving and manual driving. One of the apparatuses that detect the state of the driver detects the state in which the driver holds the steering wheel. With the contact deciding apparatus that detects the steering wheel holding state of the driver, at a position at which to attach a sensor, there is no space in which to dispose a contact decision circuit, so wires are needed to connect the sensor and contact decision circuit together. Since the contact deciding apparatus intended for the steering wheel is important in assuring safety, a function to detect wire breakage is needed. With a conventional contact deciding apparatus, a sensor electrode and a wire breakage detection electrode are attached to a steering wheel so that wire breakage can be detected (see Japanese Unexamined Patent Application Publication No. 2021-178527, for example).

The conventional contact deciding apparatus has a wire breakage detection electrode and a signal wire for wire breakage detection, the signal wire being connected to the wire breakage detection electrode, to detect wire breakage. That is, the conventional contact deciding apparatus needs constituent elements intended for wire breakage detection.

SUMMARY OF THE INVENTION

The present invention addresses the above situation of the related art by providing a contact deciding apparatus that can detect a contact failure such as wire breakage without having to have constituent element intended for wire breakage detection.

A contact deciding apparatus in an embodiment of the present invention has: a sensor unit that outputs a detection signal with a sine wave, the detection signal having an amplitude matching the capacitance between a detection target and a detection electrode attached to a contact portion that the detection target can contact; and a detection circuit that decides whether the detection target is in contact with the contact portion, according to the detection signal. The detection circuit includes: a first reference signal creating unit that creates a first reference signal with a sine wave, the first reference signal having the same frequency as the detection signal and being in phase with the detection signal; a second reference signal creating unit that creates a second reference signal with a sine wave, the second reference signal having the same frequency as the detection signal and being out of phase with the detection signal; a demodulation circuit that creates, as a first demodulation signal, a signal by multiplying the detection signal output from the sensor unit by the first reference signal, and also creates, as a second demodulation signal, a signal by multiplying the detection signal output from the sensor unit by the second reference signal; a first low-pass filter that extracts a first direct-current signal, which is the direct-current component of the first demodulation signal; a second low-pass filter that extracts a second direct-current signal, which is the direct-current component of the second demodulation signal; and a contact deciding unit that decides whether the detection target is in contact with the contact portion, according to the first direct-current signal. When there is a match between the latest direction in which the amount of change in the first direct-current signal has exceeded a first threshold and the latest direction in which the amount of change in the second direct-current signal has exceeded a second threshold, the contact deciding unit decides that the state of the connection between the sensor unit and the detection circuit is abnormal. When there is an opposite relationship between the latest direction in which the amount of change in the first direct-current signal has exceeded the first threshold and the latest direction in which the amount of change in the second direct-current signal has exceeded the second threshold, the contact deciding unit decides that the state of the connection between the sensor unit and the detection circuit is normal.

The present invention can provide a contact deciding apparatus that can detect a contact failure such as wire breakage without having to have constituent element intended for wire breakage detection.

BRIEF DESCRIPTION OF THE DRAWINGS

FIG. 7A is a graph illustrating the characteristics of a first direct-current signal and second direct-current signal;

FIG. 7B is also a graph illustrating the characteristics of the first direct-current signal and second direct-current signal;

FIG. 13A illustrates an example of an effect of the contact deciding apparatus;

DESCRIPTION OF THE PREFERRED EMBODIMENTS

An embodiment to which a contact deciding apparatus according to the present invention is applied will be described below.

Embodiment

Figure 1:
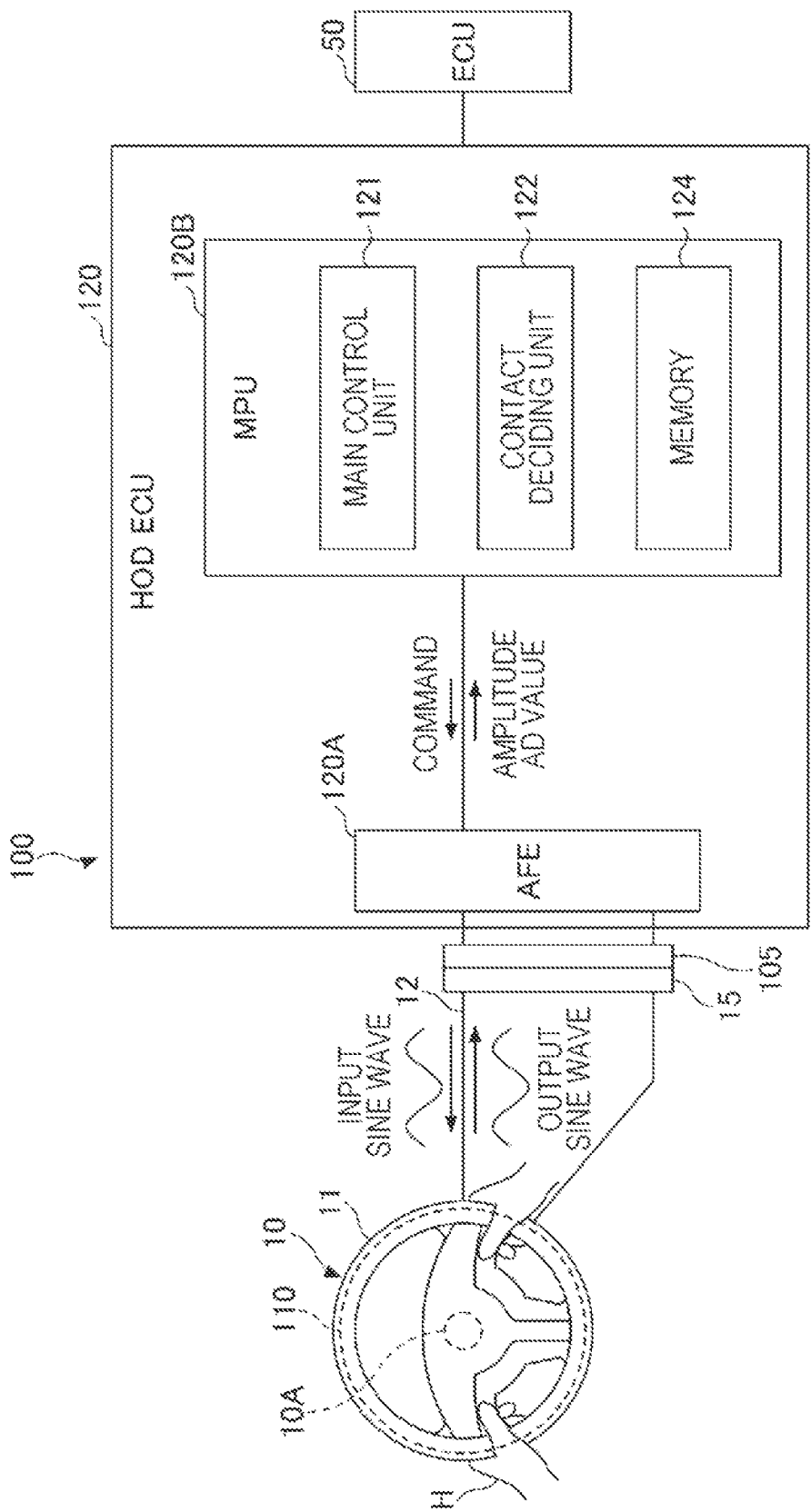
FIG. 1 illustrates a steering wheel equipped with a contact deciding apparatus in an embodiment.

FIG. 1 illustrates a steering wheel 10 equipped with a contact deciding apparatus 100 in an embodiment. As illustrated in FIG. 1, the steering wheel 10 is attached to a vehicle's body, and a capacitive sensor 110 included in the contact deciding apparatus 100 is disposed in a grip 11. The capacitive sensor 110 is an example of a sensor unit. The contact deciding apparatus 100 decides whether the hand H of the driver is in contact with the grip 11 of the steering wheel 10. The hand H is an example of a detection target. The grip 11 of the steering wheel 10 is an example of a contact portion that the detection target can contact.

The driver of the vehicle will be referred to below as the manipulator of the contact deciding apparatus 100. The contact deciding apparatus 100 decides whether the hand H of the manipulator, the hand H being the detection target, is in contact with an object to which the capacitive sensor 110 is attached. The contact deciding apparatus 100 will be described below. An action in which the manipulator contacts the object to which the capacitive sensor 110 is attached will be referred to below as a manipulation by the manipulator.

Structure of the Contact Deciding Apparatus 100

The contact deciding apparatus 100 includes a connector 105, the capacitive sensor 110, and a hand-off detection electronic control unit (HOD_ECU) 120. The HOD_ECU 120 is an example of a detection circuit. The connector 105 has a ground terminal and signal terminals for the HOD_ECU 120. The connector 105 is connected to a connector 15 having a ground terminal and signal terminals for the steering wheel 10. A signal line 12 illustrated in FIG. 1 is one of signal lines through which a plurality of signal lines included in the connector 105 and a plurality of signal lines included in the connector 15 are connected together. In FIG. 1, signal lines other than the signal line 12 connected to the capacitive sensor 110 are omitted. A ground terminal of the steering wheel 10 is electrically connected to a column shaft 10A, to which the steering wheel 10 is attached, through a core metal provided over the entire circumference of the grip 11 of the steering wheel 10. Since the connector 105 and connector 15 are connected together, the ground potential of the HOD_ECU 120 is equal to the ground potential of the steering wheel 10 and column shaft 10A.

The capacitive sensor 110 is provided over the entire circumference of the grip 11 of the steering wheel 10 in a state in which the capacitive sensor 110 is insulated from the core metal provided over the entire circumference of the grip 11 of the steering wheel 10. The capacitive sensor 110 is composed of, for example, an electrode made of a metal. The capacitive sensor 110 is connected to the HOD_ECU 120 through the signal line 12. A plurality of electrodes may be used in the capacitive sensor 110. When, for example, four capacitive sensors 110 are attached to the grip 11 of the steering wheel 10 so as to be spaced equally at intervals of 90 degrees, it is possible to detect that two hands H are in contact with the grip 11 at positions separated from each other by 90 degrees or more.

The HOD_ECU 120 is disposed in an instrument panel, as an example. The HOD_ECU 120 has an analog front end (AFE) 120A and a microprocessor unit (MPU) 120B.

The AFE 120A, which is connected to the capacitive sensor 110, enters a sine wave (specifically, an input sine wave) to the capacitive sensor 110 in response to a command accepted from the MPU 120B, and acquires a sine wave (specifically, an output sine wave) output from the capacitive sensor 110. The AFE 120A acquires the capacitance of the capacitive sensor 110 from the input sine wave and output sine wave. The AFE 120A then performs digital conversion, removes noise with a low-pass filter, and performs other processing, after which the AFE 120A outputs the resulting value to the MPU 120B as an amplitude AD value. The amplitude AD value does not necessarily have to be indicated as the capacitance of the capacitive sensor in farads. The amplitude AD value is preferably determined so that a close match is found between the sensitivity (identification limit) of the capacitive sensor 110 and one unit of the AD value. When a match is found between the sensitivity of the capacitive sensor and one unit of the AD value, the capacitance can be represented by an integer having a minimum number of digits without having to lower the resolution. When noise is removed with a low-pass filter, an amplitude AD value resulting from removing noise at a predetermined frequency or higher can be acquired. The AFE 120A creates a first direct-current signal CA as the amplitude AD value and also creates a second direct-current signal CB, after which the AFE 120A outputs these signals to the MPU 120B. The first direct-current signal CA represents the amplitude AD value, and the second direct-current signal CB is a direct-current signal created according to the capacitance of the capacitive sensor 110, separately from the first direct-current signal CA. The first direct-current signal CA and second direct-current signal CB will be described later with reference to FIGS. 4, 7A, and 7B.

The MPU 120B is implemented by a computer that includes a central processing unit (CPU), a random-access memory (RAM), a read-only memory (ROM), an input/output interface, and an internal bus. An electronic control unit (ECU) 50 is connected to the MPU 120B, as an example. The ECU 50 is a control unit that controls electronic devices in the vehicle's body to which the steering wheel 10 is attached. These electronic devices may be, for example, electronic devices related to autonomous driving of a vehicle.

The MPU 120B has a main control unit 121, a contact deciding unit 122, and a memory 124. The main control unit 121 and contact deciding unit 122 are functions, represented as functional blocks, of programs executed by the MPU 120B. The memory 124 is a functionally represented memory in the MPU 120B.

The main control unit 121 is a processing unit that controls control processing by the MPU 120B. The main control unit 121 performs processing other than processing performed by the contact deciding unit 122.

The contact deciding unit 122 decides whether a difference resulting from subtracting a reference value from the amplitude AD value (first direct-current signal CA) exceeds a threshold to decide whether the hand H is in contact with the grip 11. This decision is contact deciding processing executed by the contact deciding unit 122. The contact deciding unit 122 also notifies the ECU 50 of data representing the decision result. The reference value refers to a reference value, of the capacitance of the capacitive sensor 110, that is used when contact deciding unit 122 decides whether the hand H is in contact with the grip 11 of the steering wheel 10. Specifically, the reference value is the capacitance of the capacitive sensor 110 in a state in which the hand H is not in contact with the grip 11.

The contact deciding unit 122 also has a timer 122A used in contact deciding processing. Contact deciding processing and the timer 122A will be described later.

The contact deciding unit 122 decides whether the state of the connection between the connector 105 and the connector 15 is normal or they have a contact failure, according to the first direct-current signal CA and second direct-current signal CB.

The contact deciding unit 122 also has a timer 123A used in deciding processing for the connection state. Deciding processing for the connection state and the timer 123A will be described later.

The memory 124 stores programs, data, and the like that are necessary for the main control unit 121 and contact deciding unit 122 to perform processing. Data stored in the memory 124 includes data representing the capacitance of the capacitive sensor 110, data created by the contact deciding unit 122 in the process of processing, and other data.
Output sine wave from the capacitive sensor 110

Figure 2:
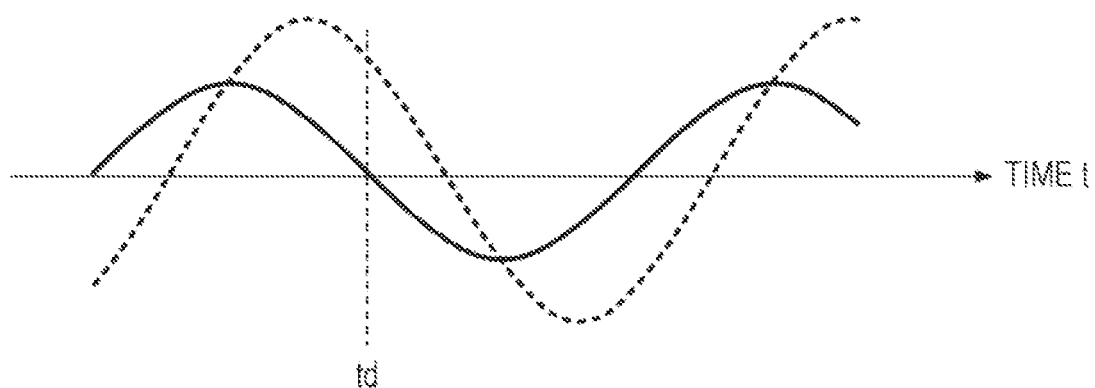
FIG. 2 illustrates an example of an output sine wave from a capacitive sensor.

FIG. 2 illustrates an example of the output sine wave from the capacitive sensor 110. In FIG. 2, the output sine wave while the hand H is off the grip 11 (while the hand H is released) is indicated by the solid line and the output sine wave while the hand H holds the grip 11 (while in contact with the grip 11) is indicated by the dashed line.

When the hand H comes into contact with the grip 11, the capacitance measured by the capacitive sensor 110 changes from the value measured while the hand H is released. Therefore, the phase and amplitude of the sine wave while the hand H is in contact with the grip 11 are different from those of the sine wave while the hand H is released. The phase and amplitude of the sine wave while the hand H is in contact with the grip 11 varies with a degree at which the hand H is in contact with the grip 11. The degree of contact indicates that the hand H slightly or strongly holds the grip 11 or the hand H in contact with the grip 11 occupies a small area or a large area, for example.

Figure 3:
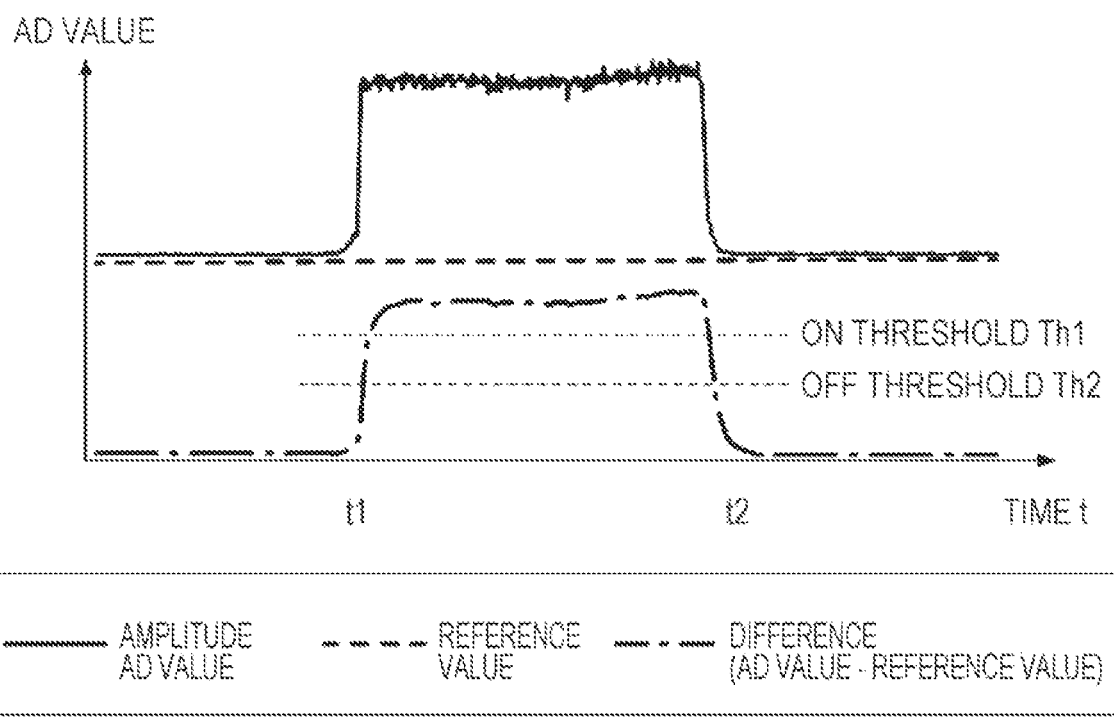
FIG. 3 illustrates decision about contact according to a reference value.

A timing at which the amplitude while the hand H is released is zero is predetermined as, for example, a detection timing td. Then, when the amplitude of the sine wave at the detection timing td, the amplitude AD value (AD value) matching the degree of the contact of the hand H can be measured. The amplitude AD value at the detection timing td can be regarded as the value matching the degree of the contact of the hand H.
Decision about Contact According to a Reference Value FIG. 3 illustrates decision about contact according to a reference value. In FIG. 3, the horizontal axis indicates time and the vertical axis indicate the AD value. In FIG. 3, the solid line indicates the amplitude AD value (first direct-current signal CA), the dashed line indicates a reference value, and the dash-dot line indicates the difference ΔAD between the amplitude AD value and the reference value (AD value−reference value). The amplitude AD value, which is output from the AFE 120A, indicates a capacitance between the capacitive sensor 110 and a conductor in the vicinity of it. The reference value indicates a capacitance that is measured between the capacitive sensor 110 and the conductor in the vicinity of it while the hand H is not present close to the capacitive sensor 110. The difference ΔAD is the difference between the capacitance between the capacitive sensor 110 and the conductor in the vicinity of it while the hand H is present close to the capacitive sensor 110 and the capacitance between the capacitive sensor 110 and the conductor in the vicinity of it while the hand H is not present close to the capacitive sensor 110. That is, the difference ΔAD is the capacitance between the capacitive sensor 110 and the hand H.

In the state earlier than time t1 in FIG. 3, the hand H is not in contact with the grip 11. When the hand H comes into contact with the grip 11 at time t1, the amplitude AD value rises from the reference value. At this time, the difference (AD value−reference value) also rises. When the difference rises to or above an On threshold Th1, the contact deciding unit 122 decides that the hand H has come into contact with the grip 11. The On threshold Th1 is an example of a first contact threshold. When the hand H is released from the grip 11 at time t2, the amplitude AD value drops. At this time, the difference (ΔD value−reference value) also drops. When the difference drops to or below an Off threshold Th2, which is lower than the On threshold Th1, the contact deciding unit 122 decides that the hand H has been released from the grip 11. The Off threshold Th2 is an example of a second contact threshold.

Figure 4:
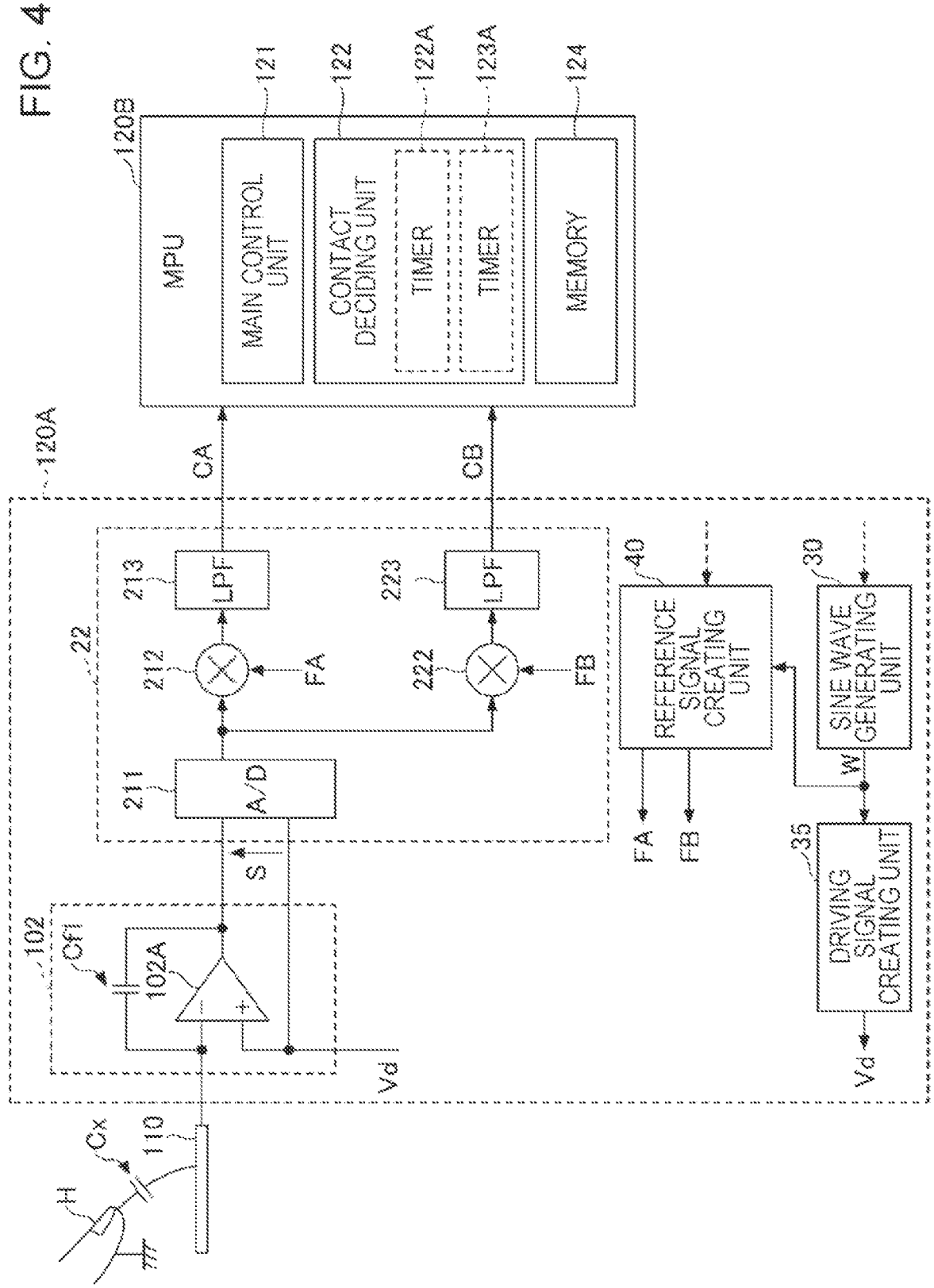
FIG. 4 illustrates an AFE.
Figure 5:
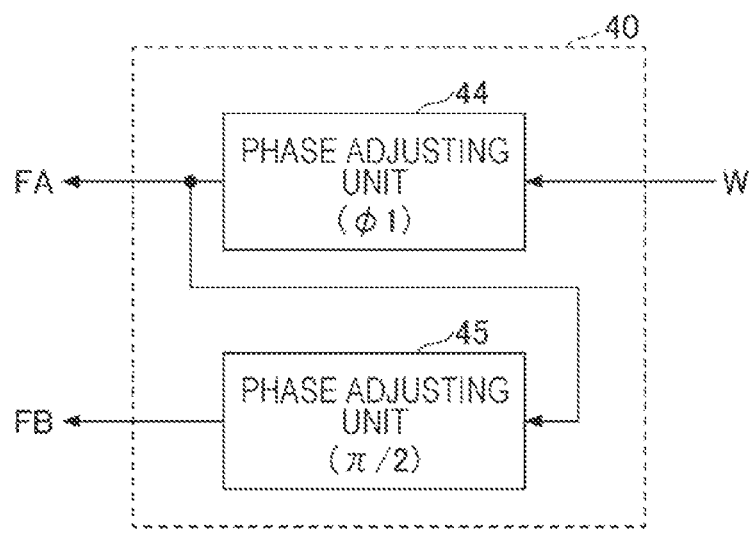
FIG. 5 illustrates a reference signal creating unit included in the AFE.

FIG. 4 illustrates the AFE 120A together with the capacitive sensor 110 and MPU 120B. In FIG. 4, a command entered from the MPU 120B into the AFE 120A is omitted. FIG. 5 illustrates a reference signal creating unit 40 included in the AFE 120A.

The AFE 120A has a capacitance detection circuit 102, a demodulation circuit 22, a sine wave generating unit 30, a driving signal creating unit 35, and the reference signal creating unit 40. In the description below, it will be assumed that a capacitor Cx is present between the hand H and the capacitive sensor 110. The reference signal creating unit 40 is an example of a first reference signal creating unit and is also an example of a second reference signal creating unit.
Capacitance Detection Circuit 102

The capacitance detection circuit 102 creates a detection signal S matching the capacitance of the capacitor Cx, according to charge transmitted to the capacitor Cx through the capacitive sensor 110. Specifically, the capacitance detection circuit 102 applies a driving signal Vd to the capacitor Cx through the capacitive sensor 110, and creates the detection signal S matching charge transmitted to the capacitor Cx in response to the applied driving signal Vd. The detection signal S has an amplitude matching the capacitance of the capacitor Cx.

The capacitance detection circuit 102 includes an operational amplifier 102A and a capacitor Cf1 as illustrated in, for example, FIG. 4. The capacitor Cf1 is connected between the inverting input terminal and output terminal of the operational amplifier 102A. The driving signal Vd with a sine wave is supplied to the non-inverting input terminal of the operational amplifier 102A by the driving signal creating unit 35. The capacitive sensor 110 is connected to the inverting input terminal of the operational amplifier 102A. The driving signal Vd is, for example, an alternating-current voltage with a sine wave. The operational amplifier 102A controls an output voltage so that a close match is found between the voltage at the inverting input terminal and the voltage at the non-inverting input terminal. Therefore, an alternating-current voltage that is substantially the same as the driving signal Vd is generated in the capacitor Cx. When an alternating-current voltage is generated in the capacitor Cx, charge changes in proportion to the alternating-current voltage and the capacitance of the capacitor Cx. The change in charge in the capacitor Cx is substantially the same as a change in charge in the capacitor Cf1. As a result, the alternating-current voltage generated in the capacitor Cf1 has an amplitude substantially proportional to the capacitance of the capacitor Cx. The detection signal S is a voltage generated across the output terminal and non-inverting input terminal of the operational amplifier 102A and is substantially the same as the alternating-current voltage generated in the capacitor Cf1. Therefore, the detection signal S has an amplitude substantially proportional to the capacitance of the capacitor Cx.

Sine Wave Generating Unit 30

The sine wave generating unit 30 creates a sine-wave signal W, from which the driving signal Vd is created, under control of the main control unit 121 in the MPU 120B. The sine wave generating unit 30 is, for example, a digital circuit that operates in synchronization with a clock from the MPU 120B. The sine-wave signal W is a digital signal having a driving frequency fd.

Driving Signal Creating Unit 35

The driving signal creating unit 35 creates the driving signal Vd with a sine wave, which is an analog signal, from the sine-wave signal W created in the sine wave generating unit 30. In an example, the driving signal Vd is an alternating-current voltage with a sine wave. In another example, however, the driving signal Vd may be an alternating-current voltage with a non-sine wave (a square wave, for example). Since the driving signal Vd is an alternating-current voltage with a sine wave, harmonic noise released from the capacitive sensor 110 can be reduced.

Reference Signal Creating Unit 40

The reference signal creating unit 40 creates a first reference signal FA and a second reference signal FB at the same time from the sine-wave signal W. The reference signal creating unit 40 has a phase adjusting unit 44 and a phase adjusting unit 45 as illustrated in FIG. 5. The phase adjusting unit 45 is connected to the output side of the phase adjusting unit 44. The phase adjusting unit 44 accepts the sine-wave signal W and outputs the first reference signal FA. The detection signal S is out of phase by $\phi1$ with the driving signal Vd. The phase adjusting unit 44 adjusts the phase of the first reference signal FA so that the detection signal S and first reference signal FA have the same phase. The first reference signal FA is output as one of output signals from the reference signal creating unit 40 and is also entered into the phase adjusting unit 45. The phase adjusting unit 45 outputs, as the second reference signal FB, a signal out of phase by one-fourth with the first reference signal FA.

The first reference signal FA is a wine-wave reference signal that has the same frequency as the detection signal S with a sine wave and also has the same phase as the detection signal S with a sine wave. The reference signal creating unit 40 creates the first reference signal FA that has a frequency equal to the driving frequency fd of the driving signal Vd entered from the driving signal creating unit 35 and has a predetermined phase $\phi1$ with the driving signal Vd.

The reference signal creating unit 40 also creates the second reference signal FB with a sine wave, the second reference signal FB having the same frequency as the detection signal S with a sine wave and being out of phase by one-fourth with the detection signal S with a sine wave. The reference signal creating unit 40 creates the second reference signal FB that has a frequency equal to the driving frequency fd and is out of phase by one-fourth with the driving signal Vd when compared with the first reference signal FA. Since the phase of the first reference signal FA substantially matches the phase of the detection signal S, the second reference signal FB is out of phase by one-fourth with the detection signal S.

Demodulation Circuit 22

The demodulation circuit 22 includes an analog-to-digital (A/D) converter 211 that converts the detection signal S in analog form to a digital signal, a multiplication circuit 212, a low-pass filter 213, a multiplication circuit 222 that multiplies the second reference signal FB and an output signal from the A/D converter 211, the output signal being a digital signal converted from the detection signal S, together, and a low-pass filter 223 that extracts a direct-current component from the result of multiplication by the multiplication circuit 222. The low-pass filter 213 is an example of a first low-pass filter. The low-pass filter 223 is an example of a second low-pass filter.

The demodulation circuit 22 creates a signal, as the first direct-current signal CA, by multiplying the detection signal S output from the capacitance detection circuit 102 by the first reference signal FA, and also creates a signal, as the second direct-current signal CB, by multiplying the detection signal S output from the capacitance detection circuit 102 by the second reference signal FB. The demodulation circuit 22 outputs the first direct-current signal CA and second direct-current signal CB to the MPU 120B.

The A/D converter 211 includes a differential amplifier that, for example, multiplies the difference between the driving signal Vd and the output signal from the operational amplifier 102A and also functions as a low-pass filter that prevents aliasing. The A/D converter 211 converts an output signal from this differential amplifier, the output signal being equivalent to an alternating-current voltage at the capacitor Cf1, to a digital signal. The multiplication circuit 212 multiplies the first reference signal FA and the detection signal S, converted to a digital signal in the A/D converter 211, together.

The multiplication circuit 222 multiplies the second reference signal FB and the detection signal S, converted to a digital signal in the A/D converter 211, together. The low-pass filter 213 removes a high-frequency component included in a first demodulation signal, which is a result of multiplication by the multiplication circuit 212, and extracts a direct-current component. The direct-current component extracted in the low-pass filter 213 is output to the MPU 120B as the first direct-current signal CA. The low-pass filter 223 removes a high-frequency component included in a second demodulation signal, which is a result of multiplication by the multiplication circuit 222, and extracts a direct-current component. The direct-current component extracted in the low-pass filter 223 is output to the MPU 120B as the second direct-current signal CB.

The first direct-current signal CA matches the direct-current component included in the signal resulting from multiplying the detection signal S and first reference signal FA together. The angular frequency $\omega$ of the detection signal S and first reference signal FA is $2\pi fd$. When the detection signal S is represented as $As\cdot\sin(\omega t-\phi1)$ and the first reference signal FA is represented as $Af\cdot\sin(\omega t-\phi1)$, a signal Y1 obtained by multiplying the detection signal S and first reference signal FA together is represented as in expression (1) below.

$$Y1 = As\cdot\sin(\omega t-\phi1) \times Af\cdot\sin(\omega t-\phi1) = -K\cdot\cos(2\omega t-2\phi1)+K \quad (1)$$

where K is $As\cdot Af/2$.

The first direct-current signal CA matches the direct-current component of the signal Y1 indicated in equation (1).

The value of the first direct-current signal CA is proportional to K. Af is a constant value, the magnitude of which is known in advance. The magnitude of As matches the capacitance of the capacitor Cx. Therefore, the first direct-current signal CA created by the demodulation circuit 22 has a magnitude matching the capacitance of the capacitor Cx. When the capacitance of the capacitor Cx changes, the phase of the detection signal S changes. Therefore, there is not always a complete match between the phase of the detection signal S and the phase of the first reference signal FA. However, the difference in phase between the detection signal S and the first reference signal FA is small enough to be negligible.

By contrast, when the second reference signal FB, which is out of phase by one-fourth of one cycle ($\pi/2$ radians) with the detection signal S is represented as $Af \cdot \sin(\omega t - \phi 1 - \pi/2)$, a signal Y2 obtained by multiplying the detection signal S and second reference signal FB together is represented as in expression (2) below.

$$Y2 = As \cdot \sin(\omega t - \phi 1) \times Af \cdot \sin(\omega t - \phi 1 - \pi/2) = -K \cdot \cos(2\omega t - 2\phi 1 - \pi/2) + K \cdot \cos(\pi/2) \qquad (2)$$

The second direct-current signal CB matches the direct-current component of the signal Y2 indicated in equation (2). The value of $\cos(\pi/2)$ is zero. Therefore, when no noise component is superimposed on the detection signal S at all, the direct-current component of the signal Y2 is zero. Therefore, the value of the second direct-current signal CB is also zero (or a reference value equivalent to zero). Conversely, the second direct-current signal CB has a frequency equal to the driving frequency fd and has a magnitude matching a noise component having a phase different from the detection signal S. Therefore, the second direct-current signal CB created by the demodulation circuit 22 has a magnitude matching a noise component, superimposed on the detection signal S, that has a frequency equal to the driving frequency fd. Since the phase of the detection signal S changes in response to a change in the capacitance of the capacitor Cx, the difference in phase between the detection signal S and the second reference signal FB is not always exactly $\pi/2$. Since the difference in phase between the detection signal S and the second reference signal FB is small enough to be negligible, however, the difference in phase between the detection signal S and the second reference signal FB can be regarded as $\pi/2$.

Problem with a Comparative Contact Deciding Apparatus

Figure 6A:
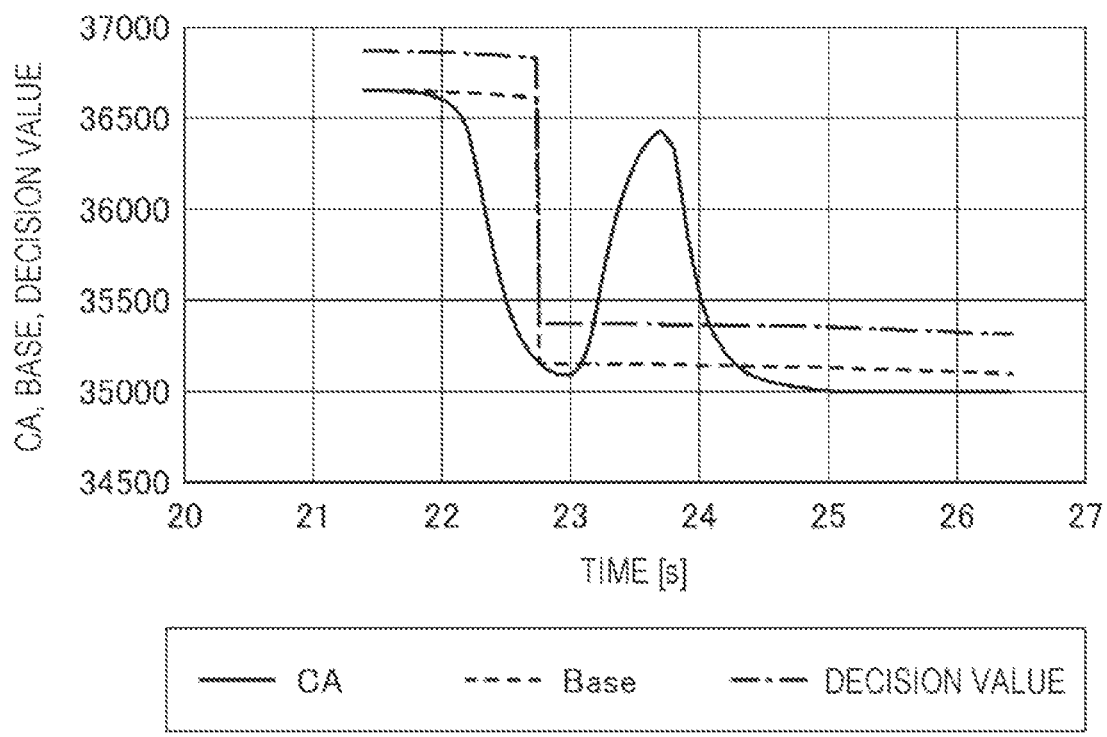
FIG. 6A is a graph illustrating a problem with a comparative contact deciding apparatus.
Figure 6B:
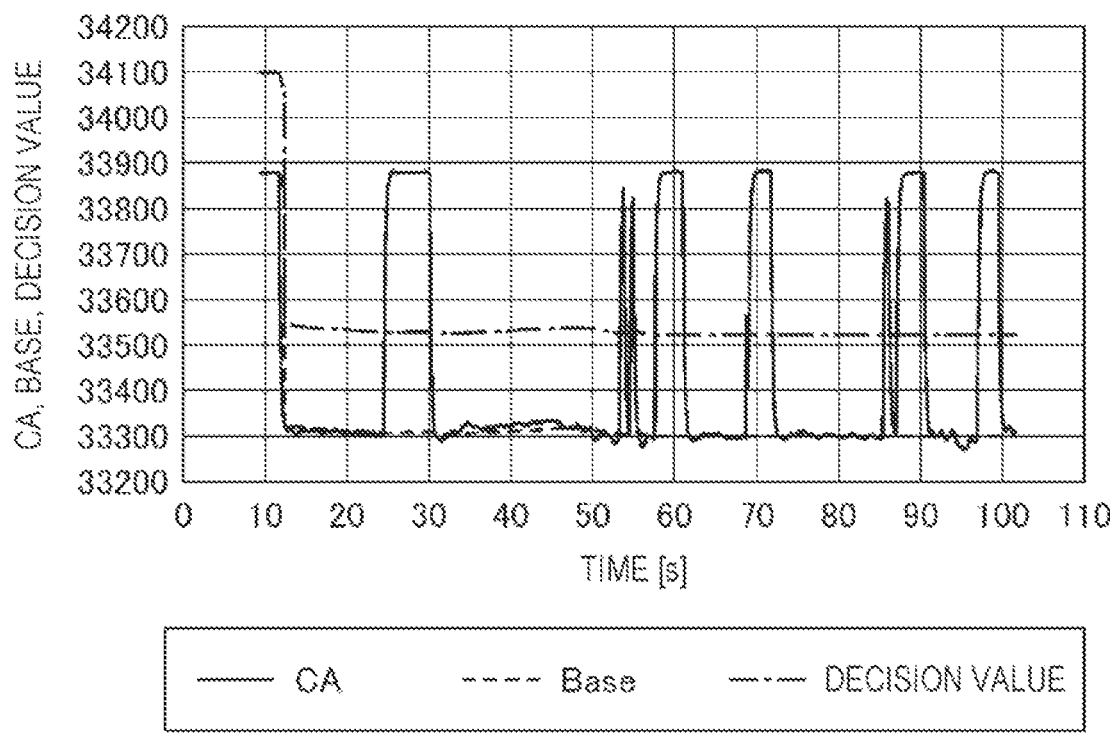
FIG. 6B is also a graph illustrating the problem with the comparative contact deciding apparatus.

FIGS. 6A and 6B each are a graph illustrating a problem with a comparative contact deciding apparatus. The comparative contact deciding apparatus has a structure in which the multiplication circuit 222 and low-pass filter 223 are eliminated from the AFE 120A illustrated in FIG. 4. Therefore, the comparative contact deciding apparatus outputs only the first direct-current signal CA and does not output the second direct-current signal CB. The MPU in the comparative contact deciding apparatus uses the first direct-current signal CA to decide whether the hand H has been placed on the grip 11 (the hand-on state has been entered).

In FIGS. 6A and 6B, the horizontal axis indicates time and the vertical axis indicate the first direct-current signal CA output from the AFE in the comparative contact deciding apparatus, the capacitance of a reference value Base, and a decision value. The decision value is obtained by adding a threshold, which is the On threshold Th1 or Off threshold Th2, for use for contact decision to the reference value Base. Although the On threshold Th1 and Off threshold Th2 take different values as illustrated in FIG. 3, a single decision value will be used here to simplify the explanation.

When the state of the connection between the connector 105 and the connector 15 is abnormal, the signal level of the first direct-current signal CA may vary. The state of the connection between the connector 105 and the connector 15 becomes abnormal when the connector 105 and connector 15 (see FIG. 1) are not adequately fitted to each other or when a wire connected to the connector 105 or connector 15 has a failure such as wire breakage. Inadequate fitting between the connector 105 and the connector 15 occurs, for example, when the connector 105 is loose against the connector 15 or when the connector 105 is not adequately fitted into the connector 15.

As a premise, the contact deciding apparatus 100 is structured so that when the ignition switch of the vehicle is switched from the Off state to the On state, the contact deciding apparatus 100 decides whether the hand H is placed on the steering wheel 10, in response to a request from the HOD_ECU 120. However, when the ignition switch of the vehicle is switched from the Off state to the On state with the hand H placed on the steering wheel 10, the reference value Base in the state in which the hand H is not placed on the steering wheel 10 cannot be correctly calculated. To prevent this, the hand H needs to be released from the steering wheel 10, and after the reference value Base is correctly calculated, the hand H needs to be placed on the steering wheel 10 again.

First, a behavior when the state of the connection between the connector 105 and the connector 15 is normal will be described with reference to FIG. 6A. In FIG. 6A, at a time of about 22 seconds, the ignition switch of the vehicle is switched from the Off state to the On state with the hand H placed on the grip 11 and then the hand H is released from the grip 11. When the first direct-current signal CA falls after the elapse of about 22 seconds, the MPU in the comparative contact deciding apparatus lowers the reference value Base to reset it. Then, the reference value Base in a state in which the hand H is not placed on the grip 11 is calculated, and the reference value Base is reset to the calculated value.

The decision value also lowers as the reference value Base lowers. When the hand H is placed on the grip 11 again at a time of about 23 seconds, the first direct-current signal CA rises. When the first direct-current signal CA reaches the decision value or above, the MPU in the comparative contact deciding apparatus decides that the hand H has been placed on the grip 11 (the hand-on state has been entered). Then, when the hand H is released from the grip 11 again at a time of about 24 seconds, the first direct-current signal CA falls. When the first direct-current signal CA reaches the decision value or below, the MPU in the comparative contact deciding apparatus decides that the hand H has been released from the grip 11. As described above, the decision value is obtained by adding a threshold, which is the On threshold Th1 or Off threshold Th2, for use for contact decision to the reference value Base.

Next, a behavior when the state of the connection between the connector 105 and the connector 15 is abnormal will be described with reference to FIG. 6B. The behavior in FIG. 6B is the one when the hand H is not placed on the grip 11. When the connection state is abnormal, an electrical connection may be maintained or may not be maintained between the connector 105 and the connector 15, as will be described below in detail.

In FIG. 6B, when the first direct-current signal CA falls after the elapse of about 13 seconds, the MPU in the comparative contact deciding apparatus resets the reference value Base to a low value. Then, the reference value Base in a state in which the hand H is not placed on the grip 11 is calculated, and the reference value Base is reset to the calculated value. The decision value also lowers as the reference value Base lowers.

Then, when the first direct-current signal CA varies as if it were noise from about 24 seconds to about 30 seconds, from about 53 seconds to about 56 seconds, from about 58 seconds to about 62 seconds, from about 68 seconds to about 73 seconds, from about 85 seconds to about 86 seconds, from about 87 seconds to about 91 seconds, and from about 96 seconds to about 100 seconds in spite of the hand H not being placed on the grip 11, the MPU in the comparative contact deciding apparatus mistakenly decides that the hand H has been placed on the grip 11 (the hand-on state has been entered). That is, an incorrect decision about the hand-on state is made.

This type of incorrect decision about the hand-on state is made when the ground potential fluctuates and the first direct-current signal CA thereby varies because an electric connection is not maintained between the connector 105 and the connector 15 due to the abnormal state of the connection between them. When the state of the connection between the connector 105 and the connector 15 is abnormal, if a member, such as the column shaft, that has a heavy weight and is maintained at the ground potential fluctuates, the first direct-current signal CA more greatly fluctuates and an incorrect decision about the hand-on state is likely to be made.

As described above, when the state of the connection between the connector 105 and the connector 15 is abnormal, the first direct-current signal CA varies as if it were noise, causing the MPU in the comparative contact deciding apparatus to mistakenly decides that the hand H has been placed on the grip 11 (the hand-on state has been entered).

Characteristics of the First Direct-Current Signal CA and Second Direct-Current Signal CB FIGS. 7A and 7B are each a graph illustrating the characteristics of the first direct-current signal CA and second direct-current signal CB. In FIGS. 7A and 7B, the horizontal axis indicates time, the left vertical axis indicates the first direct-current signal CA, and the right vertical axis indicates the second direct-current signal CB. Since there is a difference between a range in which values that the first direct-current signal CA can take fall between the maximum value and the minimum value and that range in which the values that the second direct-current signal CB can take fall, the right vertical axis and left vertical axis have different scales. In spite of this, FIGS. 7A and 7B represent behaviors in the ranges of the values that the first direct-current signal CA and second direct-current signal CB can take.

FIG. 7A illustrates the characteristics of the first direct-current signal CA and second direct-current signal CB when the state of the connection between the connector 105 and the connector 15 is normal. When the connection state is normal, in a state in which the hand H is placed on the grip 11 at a time of about 22 seconds, the first direct-current signal CA takes approximately the maximum value and the second direct-current signal CB takes approximately the minimum value. When the hand H is released from the grip 11 at the elapse of 22 seconds, the first direct-current signal CA falls toward approximately the minimum value and the second direct-current signal CB rises toward approximately the maximum value. That is, the second direct-current signal CB changes in the direction opposite to the direction in which the first direct-current signal CA changes. Thus, when the connection state is normal, the first direct-current signal CA and second direct-current signal CB change in oppose directions (directions in which they change are opposite to each other).

FIG. 7B illustrates behaviors when the state of the connection between the connector 105 and the connector 15 is abnormal. Specifically, FIG. 7B illustrates experimental results when the connection between the ground terminal of the connector 105 and the ground terminal of the connector 15 was made unstable. In FIG. 7B, the connection between the ground terminal of the connector 105 and the ground terminal of the connector 15 was repeatedly established and broken from 0 second to 110 seconds.

At a time of 10 seconds, the first direct-current signal CA and second direct-current signal CB are both at approximately the maximum value. At a time of about 12 seconds, when the first direct-current signal CA falls toward approximately the minimum value, the second direct-current signal CB also changes at the same time so as to fall toward approximately the minimum value. At a time of 24 seconds, when the first direct-current signal CA rises toward approximately the maximum value, the second direct-current signal CB also changes at the same time so as to rise toward approximately the maximum value. This is followed by similar changes: the first direct-current signal CA and second direct-current signal CB repeatedly change in the same direction at the same timing (the directions of their changes are the same).

As described above, when the state of the connection between the connector 105 and the connector 15 is normal, the first direct-current signal CA and second direct-current signal CB change in opposite directions. However, when the state of the connection between the ground terminal of the connector 105 and the ground terminal of the connector 15 is abnormal, the first direct-current signal CA and second direct-current signal CB change in the same direction at the same timing.

The contact deciding apparatus 100 in the embodiment uses the characteristics of directions in which the first direct-current signal CA and second direct-current signal CB change as described above to decide whether the state of the connection between the ground terminal of the connector 105 and the ground terminal of the connector 15 is normal or abnormal. When the state of the connection between the ground terminal of the connector 105 and the ground terminal of the connector 15 is abnormal, all terminals have a connection failure. Therefore, the connection state of the whole of the connectors can be decided from the connection state of their ground terminals. When only the signal line 12 is broken, the connection state remains in the hand-off state regardless of the state of the actual state of the contact between the hand H and the grip 11, so wire breakage can be decided. When the first direct-current signal CA and second direct-current signal CB are used, the magnitude of the noise component can also be measured. That is, with a single circuit, it is possible to measure the magnitude of the noise component and to decide whether the state of the connection between the connector 105 and the connector 15 is normal or abnormal. This can restrain the circuit from becoming large in size.

Decision Method

Figure 8:
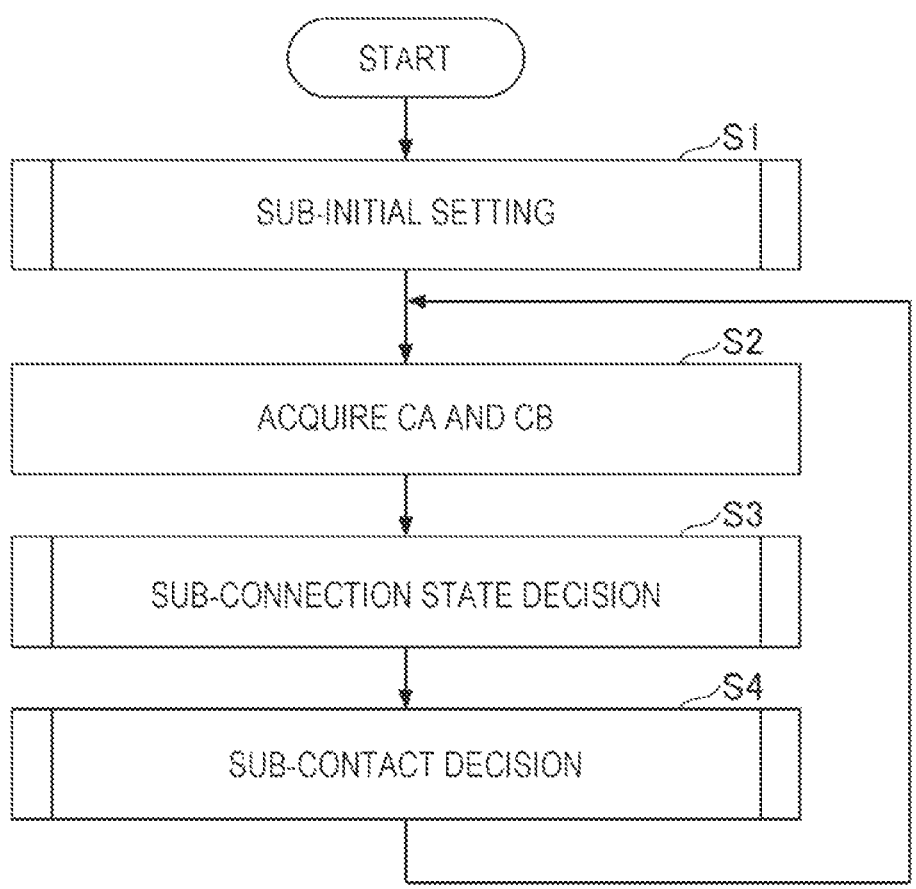
FIG. 8 illustrates decision processing executed by an MPU in the contact deciding apparatus.

FIG. 8 illustrates decision processing executed by the MPU 120B in the contact deciding apparatus 100.

The contact deciding unit 122 calls a subroutine named "sub-initial setting" and performs initial setting (step S1). In the initial setting, subroutine processing to initialize various values used in subsequent processing is performed. Details will be described below with reference to FIG. 9.

The contact deciding unit 122 acquires the first direct-current signal CA and second direct-current signal CB (step S2). This processing is to acquire the latest first direct-current signal CA and second direct-current signal CB to make a decision about the connection state.

The contact deciding unit 122 calls a subroutine named "sub-connection state decision" and performs processing to make a decision about the state of the connection between the connector 105 and the connector 15 (step S3). Details will be described below with reference to FIG. 10.

The contact deciding unit 122 calls a subroutine named "sub-contact decision" and performs processing to make a decision about a contact (step S4). Details will be described below with reference to FIG. 11.

After terminating processing in step S4, the MPU 120B causes the flow to return to step S2 and repeatedly executes processing from step S2 to step S4 at intervals of, for example, 10 ms.

Sub-Initial Processing

Figure 9:
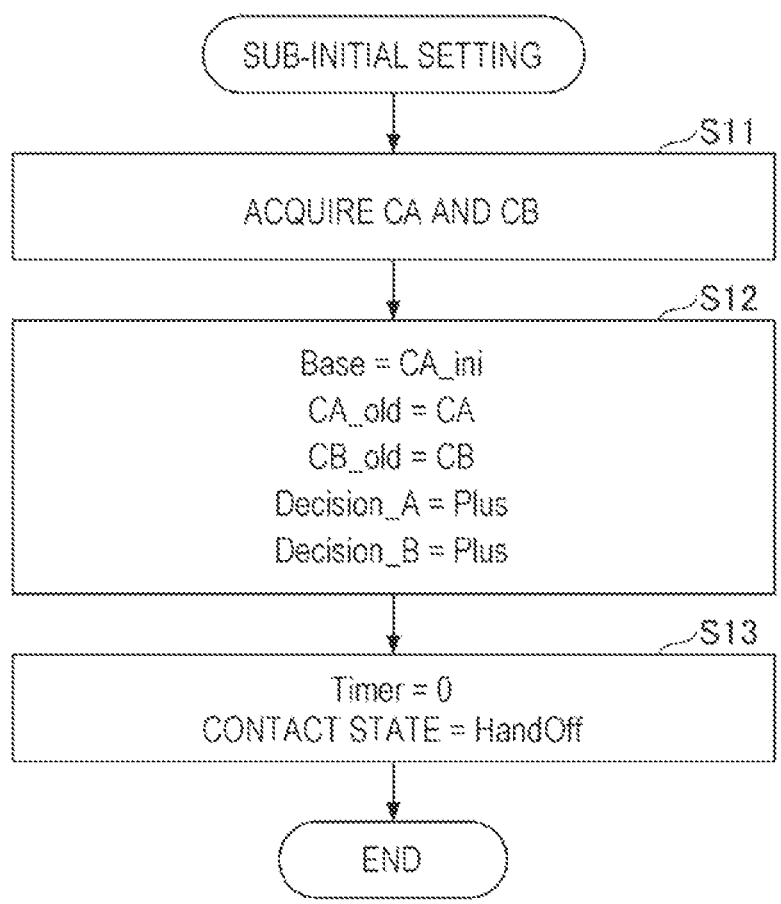
FIG. 9 is a flowchart illustrating an example of processing for sub-initial setting.

Next, initial setting processing performed according to the subroutine "sub-initial setting" in step S1 in FIG. 8 will be described with reference to FIG. 9. FIG. 9 is a flowchart illustrating an example of processing for sub-initial setting.

The contact deciding unit 122 starts processing for initial processing and acquires the first direct-current signal CA and second direct-current signal CB (step S11). This processing is to acquire the latest first direct-current signal CA and second direct-current signal CB to perform processing in initial processing.

The contact deciding unit 122 sets the reference value Base, CA_old, CB_old, Decision_A, and Decision_B (step S12). Specifically, the contact deciding unit 122 sets the reference value Base to an initial value CA_ini (Base=CA_ini). The initial value CA_ini only needs to be a value that can be taken as the reference value Base at the normal time. For example, a value measured at room temperature (20° C.) at the time of design may be used. The contact deciding unit 122 respectively sets the values of the first direct-current signal CA and second direct-current signal CB at the time of initial setting as the value CA_old of the first direct-current signal CA and the value of the CB_old of the second direct-current signal CB in the previous cycle (CA_old=CA and CB_old=CB). The contact deciding unit 122 also sets variables Decision_A and Decision_B to Plus (Decision_A=Plus and Decision_B=Plus). The variable Decision_A represents the direction in which the first direct-current signal CA changes, and the variable Decision_B represents the direction in which the second direct-current signal CB changes. Plus indicates that the change occurs in a direction in which the change is increased (+). The variables Decision_A and Decision_B may take Minus. Minus indicates that the change occurs in a direction in which the change is decreased (−). Since the variables Decision_A and Decision_B each take either of two types of values, Plus and Minus, these variables may be Boolean (logical) variables.

The contact deciding unit 122 resets the timer 123A to zero (Timer=0) and sets the hand-off state as the contact state (contact state=HandOff) (step S13). The contact state indicates whether the hand H is in contact with the grip 11 of the steering wheel 10. Since the variable representing the contact state takes either of two types of values, HandOff and HandOn, a Boolean (logical) variable may be used as the variable.

This completes initial setting processing by the contact deciding unit 122.

Sub-Connection State Decision

Next, decision processing for the connection state will be described with reference to FIG. 10, the decision processing being performed according to the subroutine "sub-connection state decision" in step S3 in FIG. 8.

Figure 10:
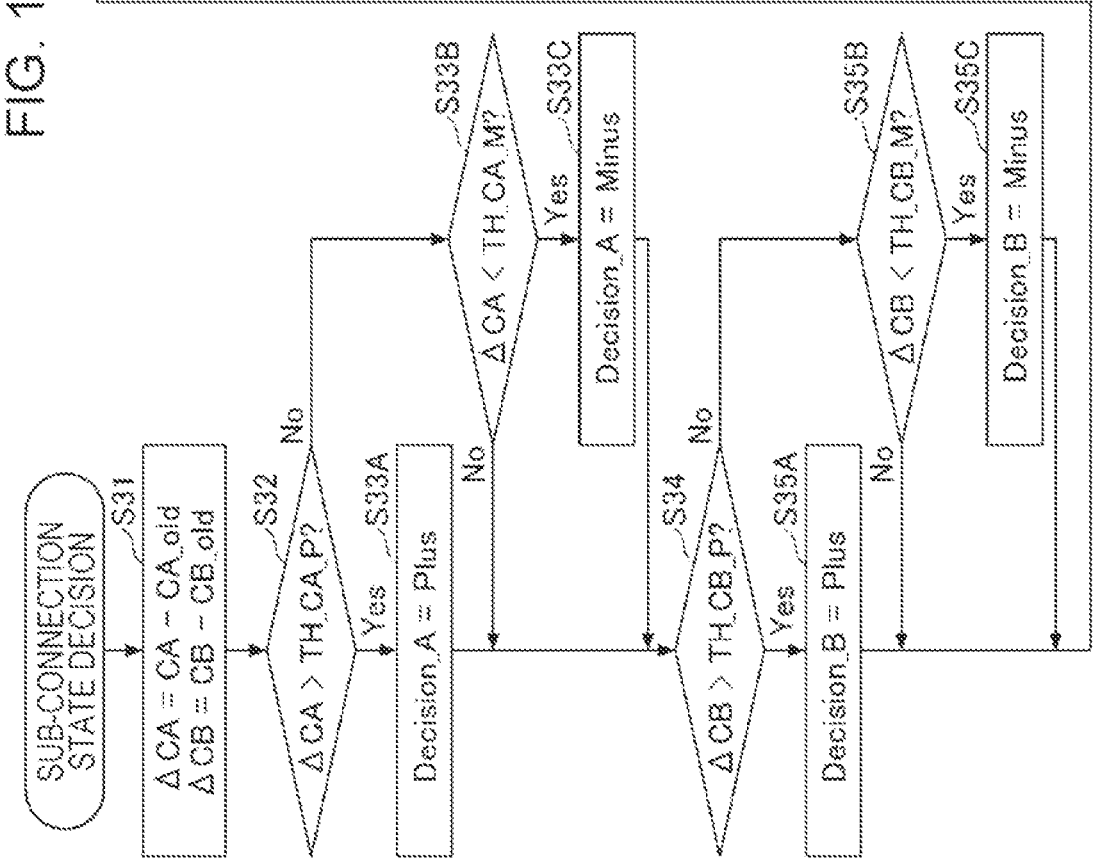
FIG. 10 is a flowchart illustrating an example of processing for sub-connection state decision.

FIG. 10 is a flowchart illustrating an example of processing for sub-connection state decision. The contact deciding unit 122 starts processing for sub-connection state decision and calculates the amounts ΔCA and ΔCB of changes in the first direct-current signal CA and second direct-current signal CB by using the first direct-current signal CA and second direct-current signal CB acquired in step S2 (step S31). The amount ΔCA of change in the first direct-current signal CA, represented by CA−CA_old, is the amount of change from the value in the previous cycle. The amount ΔCB of change in the second direct-current signal CB, represented by CB−CB_old, is the amount of change from the value in the previous cycle. CA_old immediately after the start is CA at the time of initial setting (see step S12). CB_old immediately after the start is CB at the time of initial setting (see step S12). Immediately after the start, ΔCA and ΔCB are the amounts of changes from the time of initial setting. CA_old other than immediately after the start is CA in the previous cycle (see step S38). CB_old other than immediately after the start is CB in the previous cycle (see step S38). At times other than immediately after the start, ΔCA and ΔCB are the amounts of changes from the previous cycle.

The contact deciding unit 122 decides whether the amount ΔCA of change in the first direct-current signal CA is greater than a threshold TH_CA_P (step S32). The threshold TH_CA_P is used to decide whether the amount ΔCA of change is tending to increase. The threshold TH_CA_P is an example of a first threshold when the amount ΔCA of change is tending to increase.

If the contact deciding unit 122 decides that the amount ΔCA of change in the first direct-current signal CA is greater than the threshold TH_CA_P (Yes in S32), the contact deciding unit 122 sets (updates) the variable Decision_A to Plus (Decision_A=Plus) (step S33A). After terminating processing in step S33A, the contact deciding unit 122 causes the flow to proceed to step S34.

If the contact deciding unit 122 decides in step S32 that the amount ΔCA of change in the first direct-current signal CA is not greater than the threshold TH_CA_P (No in S32), the contact deciding unit 122 decides whether the amount ΔCA of change in the first direct-current signal CA is smaller than a threshold TH_CA_M (step S33B). The threshold TH_CA_M is used to decide whether the amount ΔCA of change is tending to decrease. The threshold TH_CA_M is an example of the first threshold when the amount ΔCA of change is tending to decrease.

If the contact deciding unit 122 decides that the amount ΔCA of change in the first direct-current signal CA is smaller than the threshold TH_CA_M (Yes in S33B), the contact deciding unit 122 sets (updates) the variable Decision_A to Minus (Decision_A=Minus) (step S33C). After terminating processing in step S33C, the contact deciding unit 122 causes the flow to proceed to step S34.

If the contact deciding unit 122 decides in step S33B that the amount ΔCA of change in the first direct-current signal CA is not smaller than the threshold TH_CA_M (No in S33B), the contact deciding unit 122 causes the flow to proceed to step S34. In this case, the variable Decision_A is not updated, so the value yet to be updated is used.

The contact deciding unit 122 decides whether the amount ΔCB of change in the second direct-current signal CB is greater than a threshold TH_CB_P (step S34). The threshold TH_CB_P is used to decide whether the amount ΔCB of change is tending to increase. The threshold TH_CB_P is an example of a second threshold when the amount ΔCB of change is tending to increase.

If the contact deciding unit 122 decides that the amount ΔCB of change in the second direct-current signal CB is greater than the threshold TH_CB_P (Yes in S34), the contact deciding unit 122 sets (updates) the variable Decision_B to Plus (Decision_B=Plus) (step S35A). After terminating processing in step S35A, the contact deciding unit 122 causes the flow to proceed to step S36.

If the contact deciding unit 122 decides in step S34 that the amount ΔCB of change in the second direct-current signal CB is not greater than the threshold TH_CB_P (No in S34), the contact deciding unit 122 decides whether the amount ΔCB of change in the second direct-current signal CB is smaller than a threshold TH_CB_M (step S35B). The threshold TH_CB_M is used to decide whether the amount ΔCB of change is tending to decrease. The threshold TH_CB_M is an example of the second threshold when the amount ΔCB of change is tending to decrease.

If the contact deciding unit 122 decides that the amount ΔCB of change in the second direct-current signal CB is smaller than the threshold TH_CB_M (Yes in S35B), the contact deciding unit 122 sets (updates) the variable Decision_B to Minus (Decision_B=Minus) (step S35C). After terminating processing in step S35C, the contact deciding unit 122 causes the flow to proceed to step S36.

If the contact deciding unit 122 decides in step S35B that the amount ΔCB of change in the second direct-current signal CB is not smaller than the threshold TH_CB_M (No in S35B), the contact deciding unit 122 causes the flow to proceed to step S36. In this case, the variable Decision_B is not updated, so the value yet to be updated is used.

The contact deciding unit 122 decides whether directions in which the first direct-current signal CA and second direct-current signal CB are changing are opposite to each other (step S36). Specifically, the contact deciding unit 122 decides whether both Decision_A=Plus and Decision_B=Minus are true or both Decision_A=Minus and Decision_B=Plus are true.

If the contact deciding unit 122 decides that directions in which the first direct-current signal CA and second direct-current signal CB are changing are opposite to each other (Yes in S36), the contact deciding unit 122 sets the connection state to True (step S37A). The connection state set to True indicates that the state of the connection between the connector 105 and the connector 15 is normal. After terminating processing in step S37A, the contact deciding unit 122 causes the flow to proceed to step S38.

If the contact deciding unit 122 decides in step S36 that directions in which the first direct-current signal CA and second direct-current signal CB are changing are not opposite to each other (No in S36), the contact deciding unit 122 decides that the connection state is abnormal and sets the connection state to False (step S37B). When the contact deciding unit 122 decides that the connection state is abnormal, the contact deciding unit 122 outputs a connection failure signal that indicates that the connection state is abnormal. The connection failure signal is output from the MPU 120B to the ECU 50. Thus, the ECU 50 recognizes that the connection state is abnormal.

The contact deciding unit 122 sets the contact state to the hand-off state (contact state=HandOff) (step S37C). After terminating processing in step S37C, the contact deciding unit 122 causes the flow to proceed to step S38. The contact deciding unit 122 also notifies the ECU 50 that the connection state is the hand-off state. Thus, the ECU 50 recognizes that the connection state is the hand-off state. A reason why the ECU 50 is notified that the connection state is the hand-off state is that even if there is no change in capacitance after the start, the flow proceeds to step 37C, so when the flow proceeds to step S37C, the connection state is not always abnormal. Another reason is that even when the hand H comes into contact with the grip 11, if the hand-off state continues, an abnormal connection state can be easily found in a test travel before shipping. Still another reason is that even if an abnormal connection state occurs after shipping, the abnormal connection state is easily identified as a failure by a hand-off alarm indicator or the like. That is, a fail-safe function operates due to step S37C.

The contact deciding unit 122 respectively sets the value of CA_old of the first direct-current signal CA and the value of CB_old of the second direct-current signal CB in the previous cycle to the latest values of the first direct-current signal CA and second direct-current signal CB, the latest values being those in the current cycle, (CA_old=CA and CB_old=CB) (step S38). CA_old and CB_old are used as values in the previous cycle when the subroutine "sub-contact state decision" is executed again.

This completes decision processing for the connection state.

Sub-Contact Decision

Figure 11:
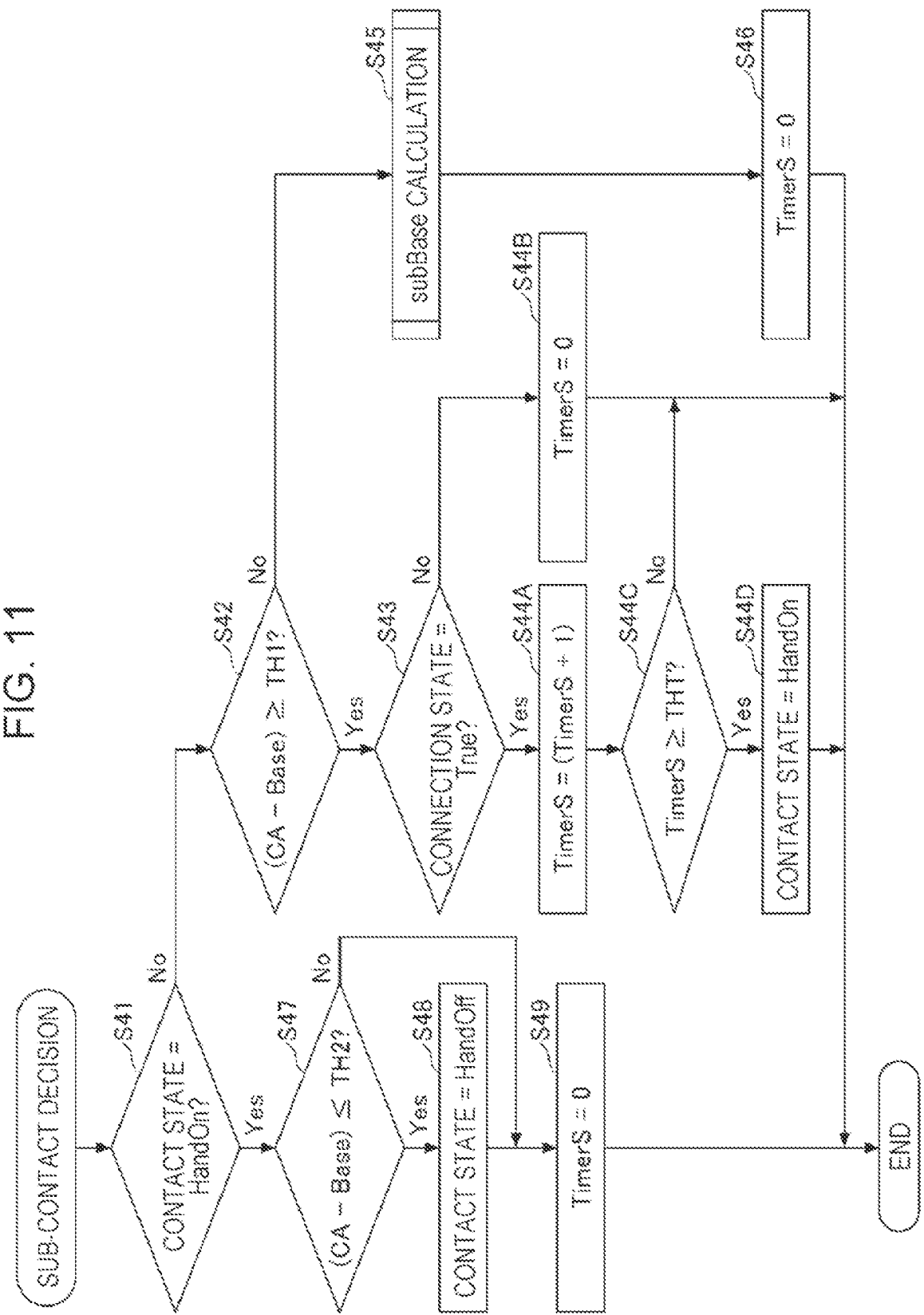
FIG. 11 is a flowchart illustrating an example of processing for sub-contact decision.

Next, processing for contact decision will be described with reference to FIG. 11. This processing is executed according to the subroutine "sub-contact decision" in step S4 in FIG. 8. FIG. 11 is a flowchart illustrating an example of processing for sub-contact decision.

The contact deciding unit 122 decides whether the contact state in the previous control cycle is a contact state (HandOn) (step S41). Since the period of one control cycle is 10 ms, the contact state of the previous control cycle is the decision result 10 ms ago.

If the previous state is not the contact state (HandOn) (No in S41), the contact deciding unit 122 decides whether the difference (CA−Base) resulting from subtracting the reference value Base from the value of the first direct-current signal CA is greater than or equal to the On threshold Th1 (step S42). The On threshold Th1 is used to decide whether there is a contact. The reference value Base indicates the capacitance of the capacitive sensor 110 in a state in which the hand H is not in contact with the grip 11. The difference (CA−Base) indicates a capacitance between the capacitive sensor 110 and the hand H.

If the contact deciding unit 122 decides that the difference ΔAD is greater than or equal to the On threshold Th1 (Yes in S42), the contact deciding unit 122 decides whether the connection state is normal (True) (step S43).

If the contact deciding unit 122 decides that the connection state is normal (True) (Yes in S43), the contact deciding unit 122 increments a count time TimerS of the timer 122A (step S44A). That is, TimerS is set to TimerS+1.

The contact deciding unit 122 decides whether the count time TimerS of the timer 122A is greater than or equal to a time threshold THT (step S44C). The value of the time threshold THT may be predetermined. The reason for making this decision is not to decide, immediately when the difference (CA−Base) exceeds the On threshold Th1, that the hand H is in contact with the grip 11 of the steering wheel 10, but to decide, when the difference (CA−Base) is above the On threshold Th1 over a certain period of time (time threshold THT), that the hand H is in contact with the grip 11. Therefore, if the contact deciding unit 122 decides that the count time TimerS is not greater than or equal to the time threshold THT (No in S44C), the contact deciding unit 122 terminates (ends) the flow. Upon the termination of the subroutine for sub-contact decision, the contact deciding unit 122 causes the flow to return to step S2.

If the contact deciding unit 122 decides that the count time TimerS is greater than or equal to the time threshold THT (Yes in S44C), the contact deciding unit 122 sets the contact state to the contact state (HandOn) (step S44D). After terminating processing in step S44D, the contact deciding unit 122 terminates (ends) the flow. Upon the termination of the subroutine for sub-contact decision, the contact deciding unit 122 causes the flow to return to step S2.

If the contact deciding unit 122 decides in step S43 that the connection state is not normal (No in S43), the contact deciding unit 122 resets the count time TimerS of the timer 122A to zero (step S44B). After terminating processing in step S44B, the contact deciding unit 122 terminates (ends) the flow. Upon the termination of the subroutine for sub-contact decision, the contact deciding unit 122 causes the flow to return to step S2.

If the contact deciding unit 122 decides in step S42 that the difference (CA−Base) is not greater than the On threshold Th1 (No in S42), the contact deciding unit 122 calls a subroutine named "subBase calculation" to perform processing to calculate reference value Base (step S45). Details will be described later with reference to FIG. 12.

The contact deciding unit 122 resets the count time TimerS of the timer 122A (step S46). That is, TimerS is set to 0 and the timer 122A restarts counting. After terminating processing in step S46, the contact deciding unit 122 terminates (ends) the flow. Upon the termination of the subroutine for sub-contact decision, the contact deciding unit 122 causes the flow to return to step S2.

If the contact deciding unit 122 decides in step S41 that the result in the previous decision is the contact state (HandOn) (Yes in S41), the contact deciding unit 122 decides whether the difference (CA−Base) resulting from subtracting the reference value Base from the value of the first direct-current signal CA is smaller than or equal to the Off threshold Th2 (step S47).

If the contact deciding unit 122 decides in step S47 that the difference (CA−Base) is smaller than or equal to the Off threshold Th2 (Yes in S47), the contact deciding unit 122 decides that the contact state is a non-contact state (HandOff) (step S48). That is, the contact state is set to HandOff.

The contact deciding unit 122 resets the count time TimerS of the timer 122A (step S49). That is, TimerS is set to 0 and the timer 122A restarts counting. After terminating processing in step S49, the contact deciding unit 122 terminates (ends) the flow. Upon the termination of the subroutine for sub-contact decision, the contact deciding unit 122 causes the flow to return to step S2.

If the contact deciding unit 122 decides in step S47 that the difference (CA−Base) is not smaller than or equal to the Off threshold Th2 (No in S47), the contact deciding unit 122 causes the flow to proceed to step S49.

SubBase Calculation

Figure 12:
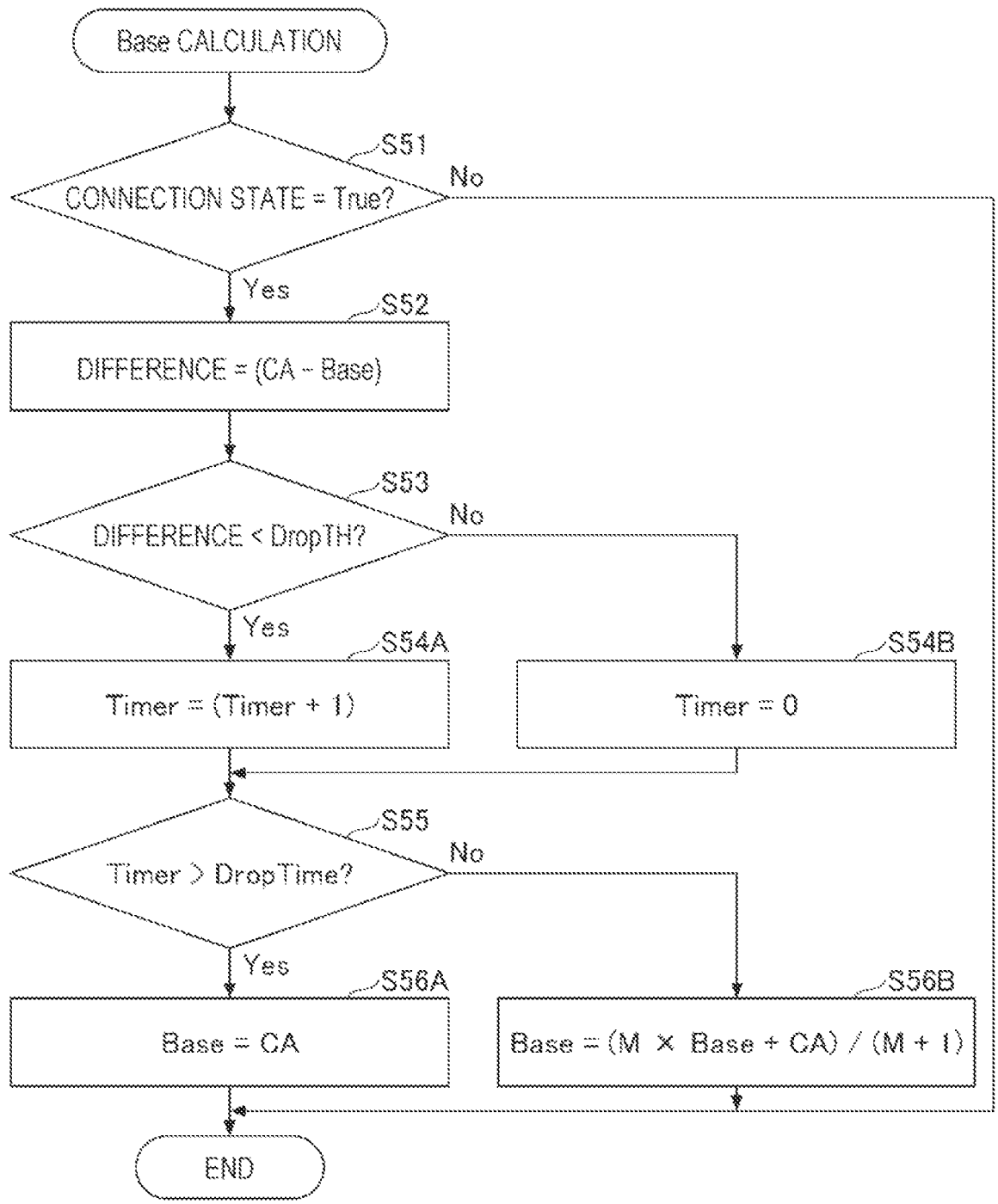
FIG. 12 is a flowchart illustrating an example of processing for subBase calculation.

Next, processing to calculate the reference value Base will be described with reference to FIG. 12. This processing is executed according to the subroutine "subBase calculation" in step S45 in FIG. 11. FIG. 12 is a flowchart illustrating an example of processing for subBase calculation.

The contact deciding unit 122 decides whether the connection state is normal (True) (step S51).

If the contact deciding unit 122 decides that the connection state is normal (True) (Yes in S51), the contact deciding unit 122 sets (updates) the difference to (CA−Base) (step S52). That is, the latest value of the first direct-current signal CA is used to update the difference between the value of the first direct-current signal CA and the reference value Base.

The contact deciding unit 122 decides whether the difference is smaller than or equal to a drop threshold DropTH (step S53). The drop threshold DropTH is used to decide whether the first direct-current signal CA has rapidly dropped as when, for example, the first direct-current signal CA has passed through the point at a time of 22 seconds in FIG. 7A.

If the contact deciding unit 122 decides that the difference is smaller than or equal to the drop threshold DropTH (Yes in S53), the contact deciding unit 122 increments a count value Timer of the timer 123A (step S54A). That is, Timer is set to Timer+1. After terminating processing in step S54A, the contact deciding unit 122 causes the flow to proceed to step S55.

If the contact deciding unit 122 decides in step S53 that the difference is not smaller than or equal to the drop threshold DropTH (No in S53), the contact deciding unit 122 resets the timer 123A (step S54B). That is, Timer is set to 0. After terminating processing in step S54B, the contact deciding unit 122 causes the flow to proceed to step S55.

The contact deciding unit 122 decides whether the count value (Timer) of the timer 123A exceeds a drop time DropTime (step S55).

If the contact deciding unit 122 decides that the count value (Timer) of the timer 123A has exceeded the drop time DropTime (Yes in S55), the contact deciding unit 122 sets the reference value Base as the value of the first direct-current signal CA (step S56A). After terminating processing in step S56B, the contact deciding unit 122 terminates processing in subBase calculation.

If the contact deciding unit 122 decides that the count value (Timer) of the timer 123A has not exceeded the drop time DropTime (No in S55), the contact deciding unit 122 calculates the reference value Base from equation (3) below (step S56B).

$$\text{Base} = \frac{M \times \text{Base (10 ms ago)} + CA}{M + 1} \qquad (3)$$

The contact deciding unit 122 multiplies the reference value Base (10 ms ago) by a weight M as in equation (3) to obtain the weighted average of the reference value (10 ms ago) and first direct-current signal CA as the reference value Base. After terminating processing in step S56B, the contact deciding unit 122 terminates processing in subBase calculation.

If the contact deciding unit 122 decides in step S51 that the connection state is not normal (No in S51), the contact deciding unit 122 terminates processing in subBase calculation without calculating the reference value Base. That is, the contact deciding unit 122 terminates processing in subBase calculation without resetting the reference value Base.

Upon the termination of the subroutine for subBase calculation, the contact deciding unit 122 causes the flow to proceed to step S46 in FIG. 11.

Effects

Figure 13B:
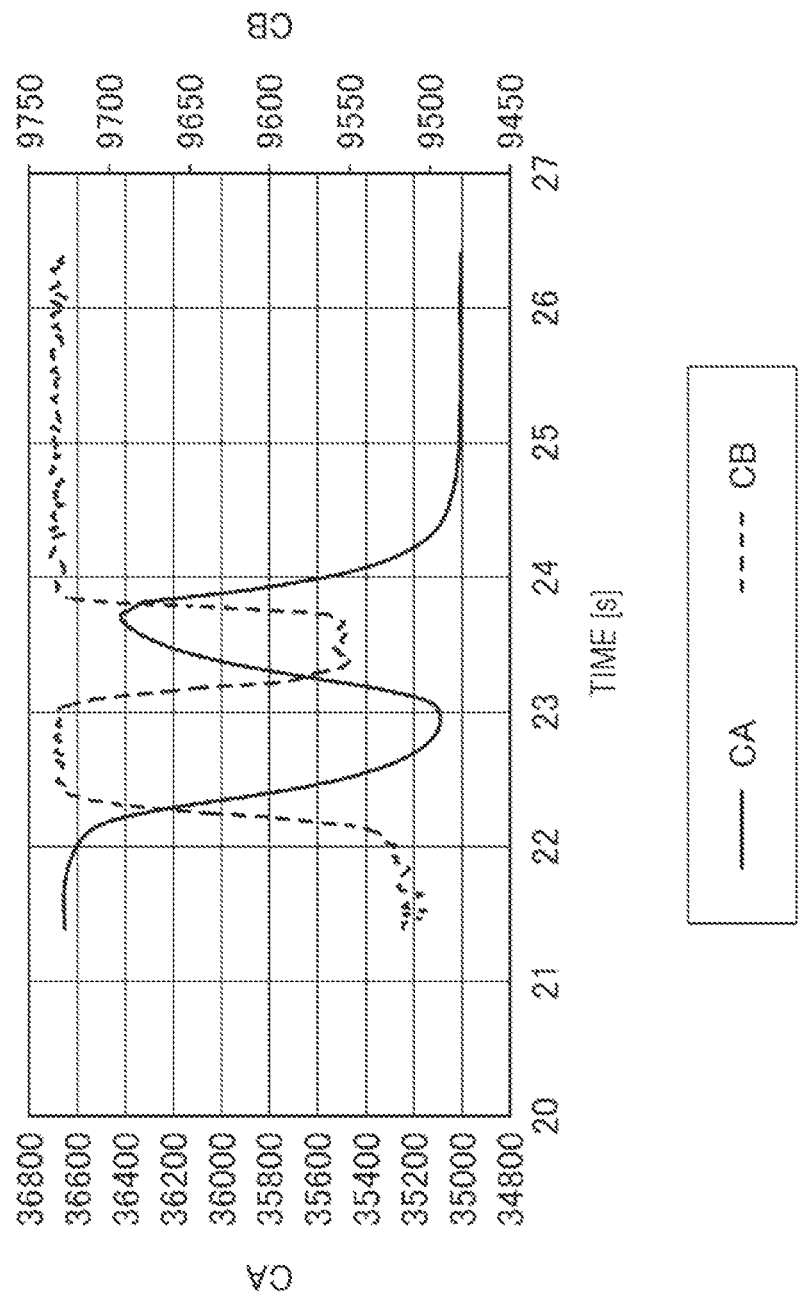
FIG. 13B illustrates an example of another effect of the contact deciding apparatus.

FIGS. 13A and 13B illustrate examples of effects of the contact deciding apparatus 100. The behaviors in FIGS. 13A and 13B are those when the state of the connection between the connector 105 and the connector 15 is normal.

In FIG. 13A, the horizontal axis indicates time and the vertical axis indicates the first direct-current signal CA, the capacitance of the reference value Base, and a decision value. The decision value is a value resulting from adding a threshold (On threshold Th1 or Off threshold Th2) used to make a decision about a contact to the reference value Base. Although the On threshold Th1 and Off threshold Th2 take different values as illustrated in FIG. 3, the decision value will be regarded here as a single value to simplify the explanation. In FIG. 13B, the horizontal axis indicates time, the left vertical axis indicates the first direct-current signal CA, and the right vertical axis indicates the second direct-current signal CB.

In FIG. 13A, at a time of about 22 seconds, the ignition switch of the vehicle is switched from the Off state to the On state with the hand H placed on the grip 11 and then the hand H is released from the grip 11. When the first direct-current signal CA falls after the elapse of about 22 seconds, the MPU 120B in the contact deciding apparatus 100 lowers the reference value Base to reset it. The reference value Base in a state in which the hand H is not placed on the grip 11 is calculated, and the reference value Base is reset to the calculated value. This behavior is similar to the behavior of the comparative contact deciding apparatus in FIG. 6A.

It is also confirmed that when the first direct-current signal CA changes, the second direct-current signal CB changes in the direction opposite to the direction in which the first direct-current signal CA changes, as illustrated in FIG. 13B.

Figure 14A:
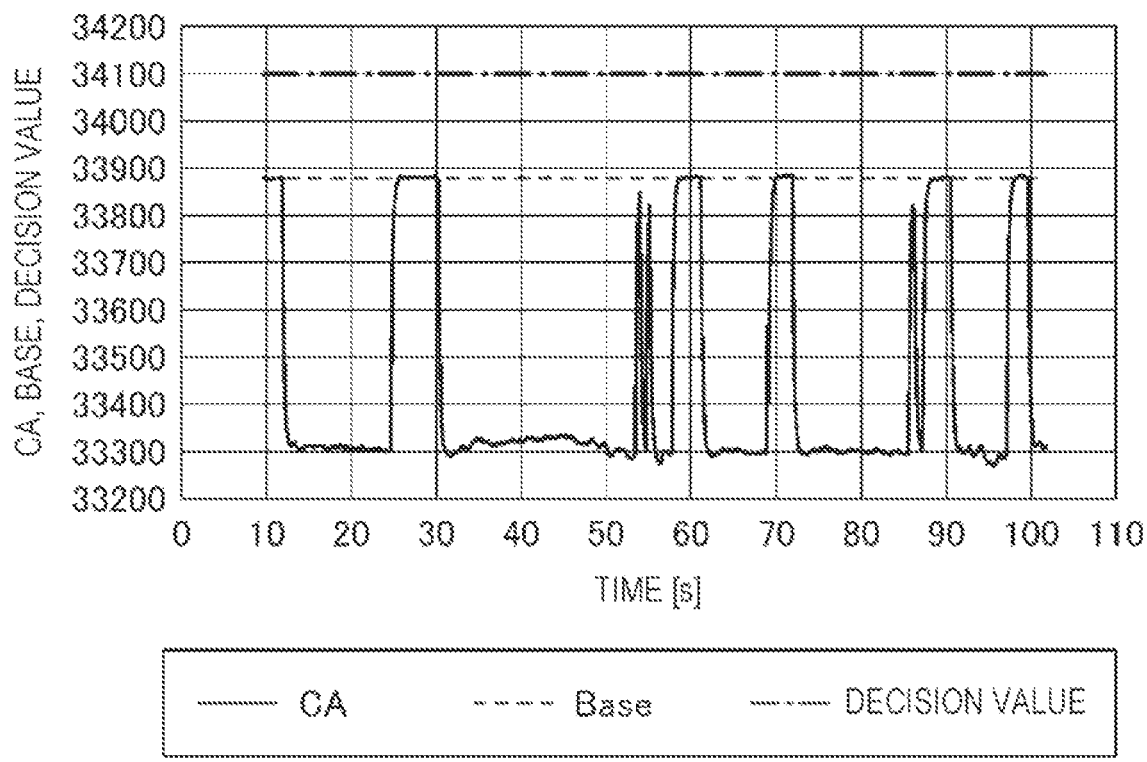
FIG. 14A illustrates an example of another effect of the contact deciding apparatus.
Figure 14B:
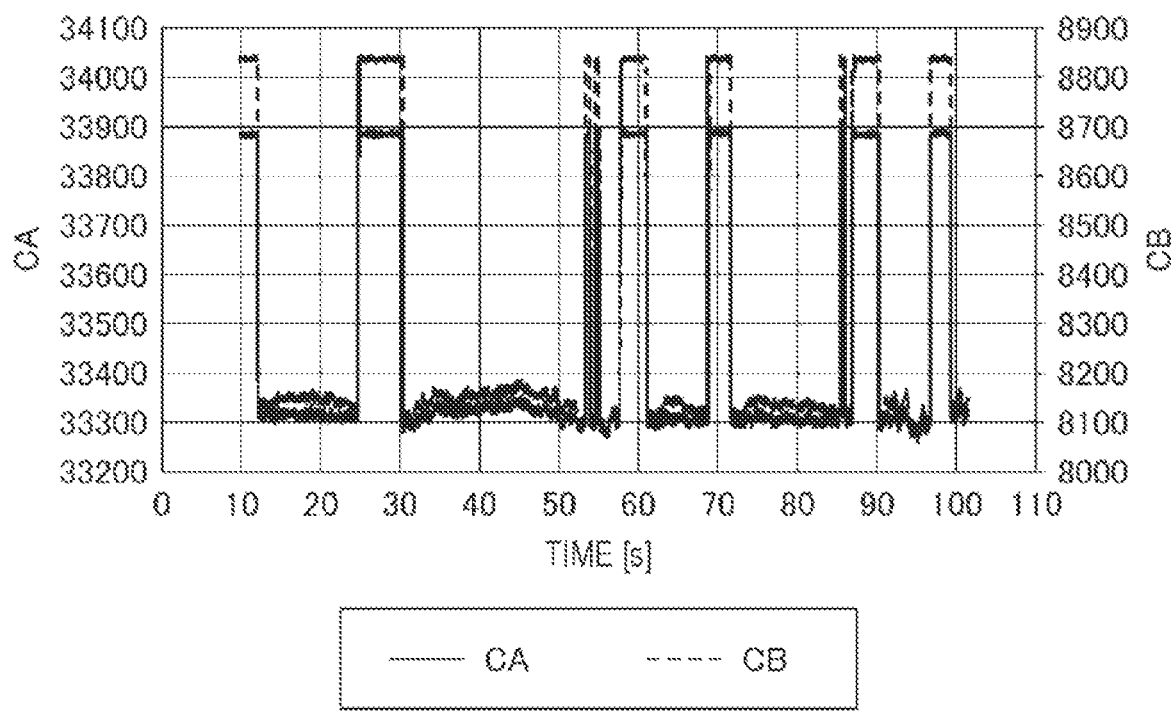
FIG. 14B illustrates an example of another effect of the contact deciding apparatus.

FIGS. 14A and 14B also illustrate examples of effects of the contact deciding apparatus 100. The behaviors in FIGS. 14A and 14B are those when the state of the connection between the connector 105 and the connector 15 is abnormal.

In FIG. 14A, even if the first direct-current signal CA rapidly drops as in the case illustrated in FIG. 6B, since the state of the connection between the connector 105 and the connector 15 is abnormal, the connection state is set to False and a No result is thereby produced in the decision in step S51 in FIG. 12. Therefore, the reference value Base takes a large value without being reset. Since the reference value Base remains at a large value, the decision value also becomes large. Even when the first direct-current signal CA changes, therefore, it does not fall to or below the decision value. This prevents a mistaken decision from being made about the hand-on state.

It is also confirmed that when the first direct-current signal CA changes, the second direct-current signal CB changes in the same direction as the first direct-current signal CA, as illustrated in FIG. 14B.

As described above, the contact deciding apparatus 100 includes the capacitive sensor 110 that outputs the detection signal S with a sine wave, the detection signal S having an amplitude matching the capacitance between the hand H and the detection electrode attached to the grip 11, which the hand H can contact, of the steering wheel 10. The contact deciding apparatus 100 also includes a first reference signal creating unit (composed of the multiplication circuit 212 in the demodulation circuit 22, the sine wave generating unit 30, and the reference signal creating unit 40) that creates the first reference signal FA with a sine wave, the first reference signal FA having the same frequency as the detection signal S and being in phase with the detection signal S, and a second reference signal creating unit (composed of the multiplication circuit 222 in the demodulation circuit 22, the sine wave generating unit 30, and the reference signal creating unit 40) that creates the second reference signal FB with a sine wave, the second reference signal FB having the same frequency as the detection signal S and being out of phase with the detection signal S. The contact deciding apparatus 100 also includes the demodulation circuit 22 that creates, as a first demodulation signal, a signal by multiplying the detection signal S output from the capacitive sensor 110 by the first reference signal FA and creates, as a second demodulation signal, a signal by multiplying the detection signal S output from the capacitive sensor 110 by the second reference signal FB, the low-pass filter 213 that extracts the first direct-current signal CA, which is the direct-current component of the first demodulation signal, and the low-pass filter 223 that extracts the second direct-current signal CB, which is the direct-current component of the second demodulation signal. The contact deciding apparatus 100 also includes the contact deciding unit 122 that decides whether the hand H is in contact with the grip 11 of the steering wheel 10, according to the first direct-current signal CA. When there is a match between the latest direction in which the amount of change in the first direct-current signal CA has exceeded or has fallen below the first threshold (TH_CA_P or TH_CA_M) and the latest direction in which the amount of change in the second direct-current signal CB has exceeded or has fallen below the second threshold (TH_CB_P or TH_CB_M), the contact deciding unit 122 decides that the state of the connection between the capacitive sensor 110 and a detection circuit is abnormal. When there is an opposite relationship between the latest direction in which the amount of change in the first direct-current signal CA has exceeded or has fallen below the first threshold (TH_CA_P or TH_CA_M) and the latest direction in which the amount of change in the second direct-current signal CB has exceeded or has fallen below the second threshold (TH_CB_P or TH_CB_M), the contact deciding unit 122 decides that the state of the connection between the capacitive sensor 110 and a detection circuit is normal.

That is, the contact deciding unit 122 decides that the connection state is abnormal when directions in which the first direct-current signal CA and second direct-current signal CB change are the same, and decides that the connection state is normal when these directions are opposite to each other.

Therefore, it is possible to provide the contact deciding apparatus 100 that can detect a contact failure such as wire breakage without having to use a physical structure specific to broken wire detection.

If the contact deciding unit 122 decides in step S37B, that the connection state is abnormal, the contact deciding unit 122 outputs a connection failure signal that indicates that the connection state is abnormal. Therefore, the contact deciding unit 122 can notify the ECU 50 that the state of the connection between the connector 105 and the connector 15 is abnormal. During the attachment of the contact deciding apparatus 100 to a vehicle, the abnormal state of the connection between the connector 105 and the connector 15 can be checked on an inspection monitor connected to the ECU 50 without the hand H having to contact the grip 11. When the connection state is abnormal, the ECU 50 is notified of the hand-off state as the contact state. In case of a connection failure, Hand Off is displayed in spite of the driver holding the grip 11 with the hand H. Therefore, the driver can recognize a connection failure without an inspection monitor.

In step S56A, the contact deciding unit 122 may update, as the reference value Base, the first direct-current signal CA in a state in which the hand H is not in contact with the grip 11 of the steering wheel 10. If the contact deciding unit 122 decides in step S37B that the connection state is abnormal, the contact deciding unit 122 may not update the reference value Base (see the case in which the result in step S51 is No). Therefore, a decision can be made about the connection state by using a decision value based on the reference value Base having a large value in a normal state before the reference value Base is updated. This can effectively suppress a mistaken decision. When the initial value of the reference value Base is set to a known value at the time of start, a decision can also be made about the connection state by using a decision value based on the reference value Base having a large value in a normal state. This can effectively suppress a mistaken decision.

The contact deciding unit 122 may have the timer 122A that counts a duration in a state in which the difference between the first direct-current signal CA and the reference value Base is greater than or equal to the On threshold Th1. When the duration counted by the timer 122A reaches a predetermined time (time threshold THT) or more, the contact deciding unit 122 may decide that the hand H has come into contact with the grip 11 of the steering wheel 10 (see step S44D). If the contact deciding unit 122 decides that the connection state is abnormal, the contact deciding unit 122 may reset the duration counted by the timer 122A (see step S44B). Therefore, when the state in which the difference between the first direct-current signal CA and the reference value Base is greater than or equal to the On threshold Th1 continues for the predetermined time (time threshold THT) or more, it is possible to decide that the hand H has been stably in contact with the grip 11 of the steering wheel 10. If the contact deciding unit 122 decides that the connection state is abnormal, the duration counted by the timer 122A is reset. When the connection state is abnormal, therefore, it is possible to suppress the decision that the hand H has come into contact with the grip 11 of the steering wheel 10.

This completes the description of the contact deciding apparatus in an exemplary embodiment of the present invention. However, the present invention is not limited to a specifically disclosed embodiment, but can be varied and modified in various ways without departing from the scope of the claims.

What is claimed is:

1. A contact deciding apparatus comprising:
   a sensor unit that outputs a detection signal with a first sine wave, the detection signal having an amplitude matching a capacitance between a detection target and a detection electrode attached to a contact portion that the detection target contacts; and
   a detection circuit that decides whether the detection target is in contact with the contact portion, according to the detection signal; wherein
   the detection circuit includes
      a first reference signal creating unit that creates a first reference signal with a second sine wave, the first reference signal having the same frequency as the detection signal and being in phase with the detection signal,
      a second reference signal creating unit that creates a second reference signal with a third sine wave, the second reference signal having the same frequency as the detection signal and being out of phase with the detection signal,
      a demodulation circuit that creates, as a first demodulation signal, a signal by multiplying the detection signal output from the sensor unit by the first reference signal, and also creates, as a second demodulation signal, a signal by multiplying the detection signal output from the sensor unit by the second reference signal,
      a first low-pass filter that extracts a first direct-current signal, which is a direct-current component of the first demodulation signal,
      a second low-pass filter that extracts a second direct-current signal, which is a direct-current component of the second demodulation signal, and
      a contact deciding unit that decides whether the detection target is in contact with the contact portion, according to the first direct-current signal, and
   the contact deciding unit decides that,
      when there is a match between a latest direction in which an amount of change in the first direct-current signal has exceeded a first threshold and a latest direction in which an amount of change in the second direct-current signal has exceeded a second threshold, a state of a connection between the sensor unit and the detection circuit is abnormal, and
      when there is an opposite relationship between the latest direction in which the amount of change in the first direct-current signal has exceeded the first threshold and the latest direction in which the amount of change in the second direct-current signal has exceeded the second threshold, the state of the connection between the sensor unit and the detection circuit is normal.

2. The contact deciding apparatus according to claim 1, wherein when the contact deciding unit decides that the state of the connection is abnormal, the contact deciding unit regards a state of the contact as a non-contact state.

3. The contact deciding apparatus according to claim 1, wherein:
   the contact deciding unit updates, as a reference value, the first direct-current signal in a state in which the detection target is not in contact with the contact portion; and
   if the contact deciding unit decides that the state of the connection is abnormal, the contact deciding unit does not update the reference value.

4. The contact deciding apparatus according to claim 3, wherein:
   the contact deciding unit has a timer that counts a duration in a state in which a difference between the first direct-current signal and the reference value is greater than or equal to a first contact threshold;
   when the duration counted by the timer reaches a predetermined time or more, the contact deciding unit decides that the detection target has come into contact with the contact portion; and
   if the contact deciding unit decides that a state of the contact is abnormal, the contact deciding unit resets the duration counted by the timer.

* * * * *